United States Patent
Masuoka et al.

(10) Patent No.: US 8,575,662 B2
(45) Date of Patent: *Nov. 5, 2013

(54) SOLID STATE IMAGING DEVICE HAVING HIGH PIXEL DENSITY

(75) Inventors: Fujio Masuoka, Tokyo (JP); Nozomu Harada, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/043,081

(22) Filed: Mar. 8, 2011

(65) Prior Publication Data

US 2011/0215381 A1 Sep. 8, 2011

Related U.S. Application Data

(60) Provisional application No. 61/311,507, filed on Mar. 8, 2010.

(30) Foreign Application Priority Data

Mar. 8, 2010 (JP) ................................. 2010-050675
Nov. 12, 2010 (JP) ................................. 2010-253589

(51) Int. Cl.
H01L 27/148 (2006.01)

(52) U.S. Cl.
USPC ....................................................... 257/229

(58) Field of Classification Search
USPC .............. 257/59, 72, 229, 223, 292, E31.001, 257/224, 225; 438/675
See application file for complete search history.

(56) References Cited

U.S. PATENT DOCUMENTS

| | | |
|---|---|---|
| 5,017,977 A | 5/1991 | Richardson |
| 5,258,635 A | 11/1993 | Nitayama et al. |
| 5,308,782 A | 5/1994 | Mazure et al. |
| 5,312,767 A | 5/1994 | Shimizu et al. |
| 5,382,816 A | 1/1995 | Mitsui |

(Continued)

FOREIGN PATENT DOCUMENTS

| | | |
|---|---|---|
| CN | 1507035 | 6/2004 |
| CN | 1610126 A | 4/2005 |

(Continued)

OTHER PUBLICATIONS

Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

(Continued)

*Primary Examiner* — Nathan Ha
(74) *Attorney, Agent, or Firm* — Brinks Hofer Gilson & Lione

(57) ABSTRACT

Each pixel of a solid state imaging device comprises a first semiconductor layer formed on a substrate, having a first-conductive type; a second semiconductor layer formed thereon, having a second-conductivity type; a third semiconductor layer formed in the upper side of the second semiconductor layer, having the first-conductivity type; a fourth semiconductor layer formed in the outer side of the third semiconductor layer, having the second-conductivity type; a gate conductor layer formed on the lower side of the second semiconductor layer via an insulating film; and a fifth semiconductor layer formed on the top surfaces of the second semiconductor layer and third semiconductor layer, having the second-conductivity type, wherein the fifth semiconductor layer and fourth semiconductor layer are connected to each other, and at least the third semiconductor layer, upper region of the second semiconductor layer, fourth semiconductor layer, and fifth semiconductor layer are formed in an island.

12 Claims, 36 Drawing Sheets

(56) References Cited

U.S. PATENT DOCUMENTS

| | | | |
|---|---|---|---|
| 5,416,350 A | 5/1995 | Watanabe | |
| 5,480,838 A | 1/1996 | Mitsui | |
| 5,627,390 A | 5/1997 | Maeda et al. | |
| 5,656,842 A | 8/1997 | Iwamatsu et al. | |
| 5,703,386 A * | 12/1997 | Yasuda et al. | 257/230 |
| 5,707,885 A | 1/1998 | Lim | |
| 5,710,447 A * | 1/1998 | Tohyama | 257/230 |
| 5,767,549 A | 6/1998 | Chen et al. | |
| 5,780,888 A | 7/1998 | Maeda et al. | |
| 5,811,336 A | 9/1998 | Kasai | |
| 5,872,037 A | 2/1999 | Iwamatsu et al. | |
| 5,905,283 A | 5/1999 | Kasai | |
| 5,994,735 A | 11/1999 | Maeda et al. | |
| 6,121,086 A | 9/2000 | Kuroda et al. | |
| 6,127,209 A | 10/2000 | Maeda et al. | |
| 6,175,138 B1 | 1/2001 | Noda | |
| 6,294,418 B1 | 9/2001 | Noble | |
| 6,373,099 B1 | 4/2002 | Kikuchi et al. | |
| 6,392,271 B1 | 5/2002 | Alavi et al. | |
| 6,406,962 B1 | 6/2002 | Agnello et al. | |
| 6,420,751 B1 | 7/2002 | Maeda et al. | |
| 6,461,900 B1 | 10/2002 | Sundaresan et al. | |
| 6,483,171 B1 | 11/2002 | Forbes et al. | |
| 6,624,459 B1 | 9/2003 | Dachtera et al. | |
| 6,658,259 B2 | 12/2003 | McIntosh | |
| 6,740,937 B1 | 5/2004 | Sushihara | |
| 6,747,314 B2 | 6/2004 | Sundaresan et al. | |
| 6,815,277 B2 | 11/2004 | Fried et al. | |
| 6,849,903 B2 | 2/2005 | Sushihara | |
| 6,861,684 B2 | 3/2005 | Skotnicki et al. | |
| 6,878,991 B1 | 4/2005 | Forbes | |
| 6,891,225 B2 | 5/2005 | Horiguchi et al. | |
| 6,943,407 B2 | 9/2005 | Ouyang et al. | |
| 7,052,941 B2 | 5/2006 | Lee | |
| 7,193,278 B2 | 3/2007 | Song | |
| 7,198,976 B2 * | 4/2007 | Hirata | 438/73 |
| 7,233,033 B2 * | 6/2007 | Koyama et al. | 257/223 |
| 7,241,655 B2 | 7/2007 | Tang et al. | |
| 7,271,052 B1 | 9/2007 | Forbes | |
| 7,368,334 B2 | 5/2008 | Yeo et al. | |
| 7,374,990 B2 | 5/2008 | Tang et al. | |
| 7,413,480 B2 | 8/2008 | Thomas | |
| 7,579,214 B2 | 8/2009 | Yamazaki et al. | |
| 7,619,675 B2 | 11/2009 | Horii | |
| 7,829,952 B2 | 11/2010 | Moniwa et al. | |
| 7,872,287 B2 | 1/2011 | Masuoka et al. | |
| 7,977,736 B2 | 7/2011 | Kim et al. | |
| 7,977,738 B2 | 7/2011 | Minami et al. | |
| 7,981,738 B2 | 7/2011 | Moniwa et al. | |
| 8,039,893 B2 | 10/2011 | Masuoka et al. | |
| 8,058,683 B2 | 11/2011 | Yoon et al. | |
| 8,067,800 B2 | 11/2011 | Hsieh | |
| 8,110,869 B2 | 2/2012 | Bhalla | |
| 8,154,076 B2 | 4/2012 | Takaishi | |
| 8,188,537 B2 | 5/2012 | Masuoka et al. | |
| 8,227,305 B2 | 7/2012 | Forbes | |
| 8,378,400 B2 | 2/2013 | Masuoka et al. | |
| 8,482,047 B2 | 7/2013 | Abbott et al. | |
| 2001/0052614 A1 | 12/2001 | Ishibashi | |
| 2002/0000624 A1 | 1/2002 | Takemura et al. | |
| 2002/0034853 A1 | 3/2002 | Alavi et al. | |
| 2002/0110039 A1 | 8/2002 | Forbes et al. | |
| 2002/0195652 A1 | 12/2002 | Maeda et al. | |
| 2003/0002093 A1 | 1/2003 | Hynecek | |
| 2003/0075758 A1 | 4/2003 | Sundaresan et al. | |
| 2004/0005755 A1 | 1/2004 | Moniwa et al. | |
| 2004/0113207 A1 | 6/2004 | Hsu et al. | |
| 2004/0135215 A1 | 7/2004 | Song | |
| 2004/0169293 A1 | 9/2004 | Sushihara | |
| 2004/0256639 A1 | 12/2004 | Ouyang et al. | |
| 2004/0262681 A1 | 12/2004 | Masuoka et al. | |
| 2005/0127404 A1 | 6/2005 | Sushihara | |
| 2005/0145911 A1 | 7/2005 | Forbes et al. | |
| 2005/0263821 A1 | 12/2005 | Cho et al. | |
| 2005/0281119 A1 | 12/2005 | Shibata et al. | |
| 2006/0006444 A1 | 1/2006 | Leslie | |
| 2006/0007333 A1 | 1/2006 | Horii | |
| 2006/0033524 A1 | 2/2006 | Sushihara | |
| 2006/0043520 A1 | 3/2006 | Jerdev et al. | |
| 2006/0046391 A1 | 3/2006 | Tang et al. | |
| 2006/0261406 A1 | 11/2006 | Chen | |
| 2007/0007601 A1 | 1/2007 | Hsu et al. | |
| 2007/0075359 A1 | 4/2007 | Yoon et al. | |
| 2007/0117324 A1 | 5/2007 | Previtali | |
| 2007/0138557 A1 | 6/2007 | Ipposhi | |
| 2007/0173006 A1 | 7/2007 | Moniwa et al. | |
| 2008/0048245 A1 | 2/2008 | Kito et al. | |
| 2008/0173936 A1 | 7/2008 | Yoon et al. | |
| 2008/0210985 A1 | 9/2008 | Ogawa et al. | |
| 2008/0227241 A1 | 9/2008 | Nakabayashi et al. | |
| 2009/0032955 A1 | 2/2009 | Tanaka et al. | |
| 2009/0057722 A1 | 3/2009 | Masuoka et al. | |
| 2009/0065832 A1 * | 3/2009 | Masuoka et al. | 257/292 |
| 2009/0085088 A1 | 4/2009 | Takaishi | |
| 2009/0114989 A1 | 5/2009 | Hamamoto | |
| 2009/0159964 A1 | 6/2009 | Lee | |
| 2009/0174024 A1 * | 7/2009 | Kim | 257/461 |
| 2009/0197379 A1 | 8/2009 | Leslie | |
| 2009/0290082 A1 | 11/2009 | Yamazaki et al. | |
| 2009/0291551 A1 | 11/2009 | Cho | |
| 2010/0052029 A1 | 3/2010 | Huang | |
| 2010/0200731 A1 | 8/2010 | Masuoka et al. | |
| 2010/0200913 A1 | 8/2010 | Masuoka et al. | |
| 2010/0207172 A1 | 8/2010 | Masuoka et al. | |
| 2010/0207201 A1 | 8/2010 | Masuoka et al. | |
| 2010/0207213 A1 | 8/2010 | Tan et al. | |
| 2010/0213525 A1 | 8/2010 | Masuoka et al. | |
| 2010/0213539 A1 | 8/2010 | Masuoka et al. | |
| 2010/0219457 A1 | 9/2010 | Masuoka et al. | |
| 2010/0219483 A1 | 9/2010 | Masuoka et al. | |
| 2010/0270611 A1 | 10/2010 | Masuoka et al. | |
| 2010/0276750 A1 | 11/2010 | Tu | |
| 2010/0295123 A1 | 11/2010 | Lung et al. | |
| 2011/0073925 A1 | 3/2011 | Park et al. | |
| 2011/0215381 A1 | 9/2011 | Masuoka et al. | |
| 2011/0254067 A1 | 10/2011 | Abbott et al. | |
| 2011/0275207 A1 | 11/2011 | Moniwa et al. | |
| 2011/0303973 A1 | 12/2011 | Masuoka et al. | |
| 2011/0303985 A1 | 12/2011 | Masuoka et al. | |
| 2012/0086051 A1 | 4/2012 | Wang et al. | |
| 2012/0196415 A1 | 8/2012 | Masuoka et al. | |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 | 4/1995 |

(56) References Cited

FOREIGN PATENT DOCUMENTS

| | | |
|---|---|---|
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Yonemoto, Kazuya, "A CMOS Image Sensor with a Simple FPN-Reduction Technology and a Hole Accumulated Diode," 2000 IEEE International Solid-State Circuits Conference, 9 pages.

Chen, Yijian et al., "Vertical integrated-gate CMOS for ultra-dense IC", *Microelectronic Engineering*, vol. 83, 2006, pp. 1745-1748.

Office Action for Chinese Patent Application Serial No. 200980103454.9, dated Oct. 31, 2012, 7 pages.

Office Action for Chinese Patent Application Serial No. 200980103505.8, dated Nov. 1, 2012, 5 pages.

Office Action for Chinese Patent Application Serial No. 201010171435.4, dated Dec. 21, 2012, 7 pages.

Office Action for Chinese Patent Application Serial No. 2011100647037, dated Nov. 14, 2012, 6 pages.

Office Action for Japanese Patent Application Serial No. 2009-538870, dated Nov. 8, 2012, 4 pages.

Restriction Requirement for U.S. Appl. No. 13/412,959, dated Nov. 8, 2012, 6 pages.

European Search Report for counterpart European Application No. 09705485.2, dated Feb. 14, 2011, 5 pages.

Extended European Search Report for European Application No. 10009574.4, dated May 15, 2012, 6 pages.

Extened European Search Report for European Application No. 10009579.3, dated Jun. 11, 2012, 11 pages.

Guidash, R.M. et al. "A 0.6 μm CMOS Pinned Photodiode Color Imager Technology", *IEDM Digest Papers*, pp. 927-929, 1997.

Hieda, K. et al., "New Effects of Trench Isolated Transistor Using Side-Wall Gates", *VLSI Research Center*, Toshiba Corporation, 1987, 4 pages.

International Search Report for International Application No. PCT/JP2007/071052, dated Jan. 29, 2008, 6 pages.

International Search Report for International Application No. PCT/JP2008/051301, dated Apr. 1, 2008, 2 pages.

International Search Report for International Application No. PCT/JP2008/051302, dated Apr. 8, 2008, 2 pages.

International Search Report for International Application No. PCT/JP2009/051460, dated Apr. 21, 2009, 2 pages.

International Search Report for International Application No. PCT/JP2009/051461, dated Apr. 21, 2009, 2 pages.

Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.

Mendis, Sunetra K. et al. "A 128×128 CMOS Active Pixel Image Sensor for Highly Integrated Imaging System", *IEDM93, Digest Papers*, 22.6.1, pp. 583-586, 1993.

Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.

Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.

Office Action from co-pending U.S. Appl. No. 12/894,923, dated Oct. 2, 2012, 21 pages.

Office Action from co-pending U.S. Appl. No. 13/043,081, dated Jul. 16, 2012, 6 pages.

Office Action from co-pending U.S. Appl. No. 13/046,113, dated Jan. 9, 2013, 6 pages.

Office Action from co-pending U.S. Appl. No. 13/113,482, dated Jan. 2, 2013, 9 pages.

Office Action from co-pending U.S. Appl. No. 13/412,959, dated Dec. 7, 2012, 9 pages.

Written Opinion of the International Searching Authority for International Application No. PCT/JP2007/071052, dated Jan. 29, 2008, 9 pages.

Written Opinion of the International Searching Authority for International Application No. PCT/JP2008/051301, dated Apr. 1, 2008, 5 pages.

Written Opinion of the International Searching Authority for International Application No. PCT/JP2008/051302, dated Apr. 8, 2008, 5 pages.

Written Opinion of the International Searching Authority for International Application No. PCT/JP2009/051460, dated Apr. 21, 2009, 5 pages.

Written Opinion of the International Searching Authority for International Application No. PCT/JP2009/051461, dated Apr. 21, 2009, 6 pages.

(56) References Cited

OTHER PUBLICATIONS

Wu et al., "High Performance 22/20nm FinFET CMOS Devices with Advanced High-K/Metal Gate Scheme", IEEE, pp. 27.1.1-27.1.4, 2010.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
Choi, Yang-Kyu et al., "FinFET Process Refinements for Improved Mobility and Gate Work Function Engineering," IEEE, 2002, 4 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 12001395.8, dated Apr. 26, 2012, 7 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2008/051300, dated May 13, 2008, 4 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Nakamura, Jun-ichi et al., "Nondestructive Readout Mode Static Induction Transistor (SIT) Photo Sensors," IEEE Transactions on Electron Devices, 1993, vol. 40, pp. 334-341.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action form co-pending U.S. Appl. No. 12/704,935, dated Nov. 18, 2011, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2008/051300, dated Aug. 30, 2010, 8 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/058629, dated Jun. 2, 2009, 4 pages.
Wuu, S.G. et al., "A Leading-Edge 0.9 μm Pixel CMOS Image Sensor Technology with Backside Illumination: Future Challenges for Pixel Scaling", *IEDM2010 Digest Papers*, 14.1.1, pp. 332-335, 2010.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Office Action for Korean Patent Application U.S. Appl. No. 9-5-2013-010869116, dated Feb. 18, 2013, 4 pages.
Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.
Office Action for U.S. Appl. No. 13/917,040 dated Aug. 6, 2013, 5 pages.
Office Action for U.S. Appl. No. 13/116,506, dated Jul. 18, 2013, 12 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.
Notice of Allowance for U.S. Appl. No. 12/704,935, dated May 16, 2013, 10 pages.
Notice of Allowance for U.S. Appl. No. 13/046,113, dated May 13 2012, 10 pages.

(56) References Cited

OTHER PUBLICATIONS

Notice of Allowance for U.S. Appl. No. 13/412,959, dated May 8, 2013, 9 pages.

English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.

* cited by examiner

SOLID STATE IMAGING DEVICE HAVING HIGH PIXEL DENSITY

RELATED APPLICATIONS

Pursuant to 35 U.S.C. §119(e), this application claims the benefit of the filing date of Provisional U.S. Patent Application Ser. No. 61/311,507 filed on Mar. 8, 2010. This application also claims priority under 35 U.S.C. §119(a) to JP2010-050675 filed on Mar. 8, 2010 and JP2010-253589 filed on Nov. 12, 2010. The entire contents of these applications are hereby incorporated by reference.

BACKGROUND OF THE INVENTION

1. Field of the Invention

The present invention relates to a solid state imaging device and particularly to a solid state imaging device having reduced residual images, dark current, noise, mixed color, and a high pixel density.

2. Description of the Related Art

Currently, CCD and CMOS solid state imaging devices are extensively used in various video cameras and still cameras. Improvement in performance of solid state imaging devices, such as higher resolutions and higher sensitivity, is always demanded. Technical innovations for higher pixel densities have been made to realize higher resolution solid state imaging devices. Furthermore, technical innovations for lower noise have been made to realize highly sensitive solid state imaging devices.

A prior art solid state imaging device is disclosed in K. Yonemoto, H. Sumi, R. Suzuki, T. Ueno's: "A CMOS Image Sensor with a Simple FPN-Reduction Technology and a Hole Accumulated Diode," 2000 IEEE International Solid-State Circuits Conference, Digest Papers, MP6. 1 (2000). This prior art CMOS solid state imaging device is shown in FIG. 24A. FIG. 24A is an illustration showing the structure of a pixel of the CMOS solid state imaging device. The CMOS solid state imaging device comprises a PN photodiode PD, a transfer gate TG joined to the PN photodiode PD, a floating diode FD joined to a channel 20 below an electrode of the transfer gate TG, an amplifying MOS transistor 21, a first pixel selection MOS transistor 22 connected to the amplifying MOS transistor 21, a reset MOS transistor 23, and a second pixel selection MOS transistor 24 connected to the transfer gate TG. The PN photodiode PD has a photodiode surface P+ layer 19 on the surface of a photodiode N layer 27. The photodiode surface P+ layer 19 is connected to a channel stopper P+ layer 18. The amplifying MOS transistor 21 has a gate AG connected to the floating diode FD. The reset MOS transistor 23 has a reset gate RG (n) connected to the floating diode FD and a reset drain RD diode. The gates of the first and second pixel selection MOS transistors 22 and 24 are connected to a column scanning circuit joined to a column selection line RL (m). A row selection line CL (n) joined to the source of the second pixel selection MOS transistor 24 and the gate RG (n) of the reset MOS transistor 23 are connected to a row scanning circuit. The reset drain RD of the reset MOS transistor 23 and the drain of the amplifying MOS transistor 21 are connected to a power supply line at voltage $V_{dd}$. The source of the first pixel selection. MOS transistor 22 is connected to a signal line 25.

Signal charges (electrons in this case) generated by light irradiation are accumulated in the PN photodiode PD. The accumulated signal charges are transferred to the floating diode FD when an ON voltage is applied to the transfer gate TG. The potential of the floating diode FD changes according to the signal charge packets. At the same time, the gate voltage of the amplifying MOS transistor 21 connected to the floating diode FD changes according to the signal charge packets. When an ON voltage is applied to the gate of the first pixel selection MOS transistor 22, a signal current according to the gate voltage of the amplifying MOS transistor 21 that has changed according to the signal charge packets runs through the signal line 25. The current is read as an output.

FIG. 24B shows the potential profile along a section line A-A in FIG. 24A when an ON voltage is applied to the transfer gate TG and the signal charges accumulated in the photodiode PD are transferred to the floating diode FD. In FIG. 24B, signal charges 26a, 26b, and 26c are shown by hatching for distinction. The signal charges 26a accumulated in the photodiode PD are transferred to the floating diode FD. The signal charges 26b transferred from the floating diode FD modulate the gate voltage of the amplifying MOS transistor 21. Here, among the deepest potential $\Phi_{mp}$ in the photodiode PD when there is no signal charge, the potential $\Phi_{tg}$ of the channel 20 when an ON voltage is applied to the transfer gate TG, and the potential $\Phi_{fg}$ of the floating diode FD when there is no transferred signal charge, $\Phi_{fg}$ is the deepest, $\Phi_{tg}$ is the second deepest, and $\Phi_{mg}$ is the shallowest. The signal charges consist of electrons in the pixel, establishing the relationship $\Phi_{fg} > \Phi_{tg} > \Phi_{mp}$. The channel stopper P+ layer 18 has a potential of 0 V. The potential profile relationship allows most signal charges in the photodiode PD to be transferred to the floating diode FD. Consequently, trailing residual images can be prevented when images of moving objects are captured. Furthermore, the above structure can prevent kTC noise, which otherwise causes deteriorated sensitivity. The signal charges 26b in the floating diode FD are removed through the reset drain RD when a voltage is applied to the reset gate RG (n). In such a case, a certain level of charges 26c remains in the floating diode FD.

The signal charges can completely be transferred from the photodiode PD to the floating diode FD when the P+ layer 19 on the surface of the N layer 27 of the photodiode PD ("the photodiode surface P+ layer" hereafter) is connected to the channel stopper P+ layer 18 to which 0 V is applied so that the photodiode surface P+ layer 19 is fixed (pinned) to 0 V. FIG. 24C shows the potential profile through the $SiO_2$ film, photodiode surface P+ layer 19, photodiode N layer 27, and photodiode P layer 28 along a section line B-B in FIG. 24A. FIG. 24C shows signal charges 26d by hatching for distinction. The deepest potential $\Phi_{mp}$ in the photodiode PD when there is no signal charge is within the photodiode N layer 27. Therefore, the signal charges 26d are present in the inner photodiode N layer 27 and photodiode P layer 28 rather than in the photodiode surface P+ layer 19 of which the potential is pinned. Holes 29 are accumulated in the photodiode surface P+ layer 19. The holes 29 are recombined to electrons thermally excited due to the SiO2-Si interface states and prevent the electrons infusing into the signal charges 26d, and no dark current occurs.

If the CMOS solid state imaging device shown in FIG. 24A does not have the photodiode PD surface P+ layer 19 joined to the channel stopper P+ layer 18 having a fixed potential of 0V, the photodiode PD can directly be connected to the gate AG of the amplifying MOS transistor 21. In this way, the voltage of the gate AG of the amplifying MOS transistor 21 can directly be changed according to the signal charges accumulated in the photodiode PD for imaging operation. However, such a structure may cause residual images and increase kTC noise and dark current as mentioned above. On the other hand, the photodiode PD surface P+ layer 19 does not allow a contact hole to be formed on the photodiode PD so as to connect the photodiode PD to the gate AG of the amplifying MOS transistor 21 via metal wiring through the contact hole. Therefore, the transfer gate TG and floating diode FD have to newly be added. Such newly added regions hamper increase in the pixel density.

Other problems of prior art CMOS solid state imaging devices include deteriorated resolution and mixed color in color imaging.

SUMMARY OF THE INVENTION

The present invention is made in view of the above circumstances and has the objective of realizing a solid state imaging device having reduced residual images, dark current, and noise, and a high pixel density. Another purpose of the present invention is to realize a solid state imaging device preventing deteriorated resolution and mixed color in color imaging.

In order to achieve the above purposes, the solid state imaging device of the present invention is a solid state imaging device including one or multiple pixels, each of the pixels comprising a first semiconductor layer formed on a substrate, a second semiconductor layer formed on the first semiconductor layer, a first insulating film formed on a lower side of the second semiconductor layer, a gate conductor layer formed on the lower side of the second semiconductor layer via the first insulating film, a third semiconductor layer formed in an upper side of the second semiconductor layer, a fourth semiconductor layer formed on a side of the third semiconductor layer that is not facing a side of the second semiconductor layer, and a fifth semiconductor layer formed on top of the second semiconductor layer and the third semiconductor layer, the fifth semiconductor layer electrically connected to the fourth semiconductor layer, wherein at least the third semiconductor layer, the upper region of the second semiconductor layer where the third semiconductor layer is formed, the fourth semiconductor layer, and the fifth semiconductor layer are formed in an island, a diode comprises the second semiconductor layer and the third semiconductor layer, a junction transistor comprises the diode serving as a gate thereof and the second semiconductor layer serving as a channel thereof, the channel being between the first semiconductor layer and the fifth semiconductor layer, a MOS transistor comprises the second semiconductor layer serving as a channel thereof between the first semiconductor layer and the third semiconductor layer and the gate semiconductor layer functioning as a gate thereof, a signal charge generated by a electromagnetic energy wave is accumulated in the diode, current flowing to the junction transistor and changing in accordance with amount of the signal charge accumulated in the diode is detected as a signal, the signal charge accumulated in the diode is removed at the first semiconductor layer through the MOS transistor channel, the fourth semiconductor layer and the fifth semiconductor layer have same voltage.

Preferably, the solid state imaging device of the present invention further comprises a first conductor layer formed on the side of the fourth semiconductor layer via the first insulating film so as to enclose the third semiconductor layer, the upper region of the second semiconductor layer, and the fourth semiconductor layer in the shape of an island, the first conductor layer including a light-blocking conductive material, wherein the first conductor layer is connected to the fifth semiconductor layer.

The present invention provides a solid state imaging device having reduced residual images, dark current, and noise and a high pixel density.

A light-blocking layer is provided to enclose the semiconductor layer in the shape of an island, whereby mixed color and deteriorated resolution can be prevented.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

Embodiments of the present invention will be described hereafter with reference to FIGS. 1A to 23.

Embodiment 1

A solid state imaging device 100 according to Embodiment 1 of the present invention will be described hereafter with reference to FIGS. 1A to 4.

The solid state imaging device 100 according to this embodiment has the basic pixel structure similar to that of the solid state imaging device described in International Publication No. WO 2009/034623, the content of which is entirely incorporated herein by reference.

Figure 1A:
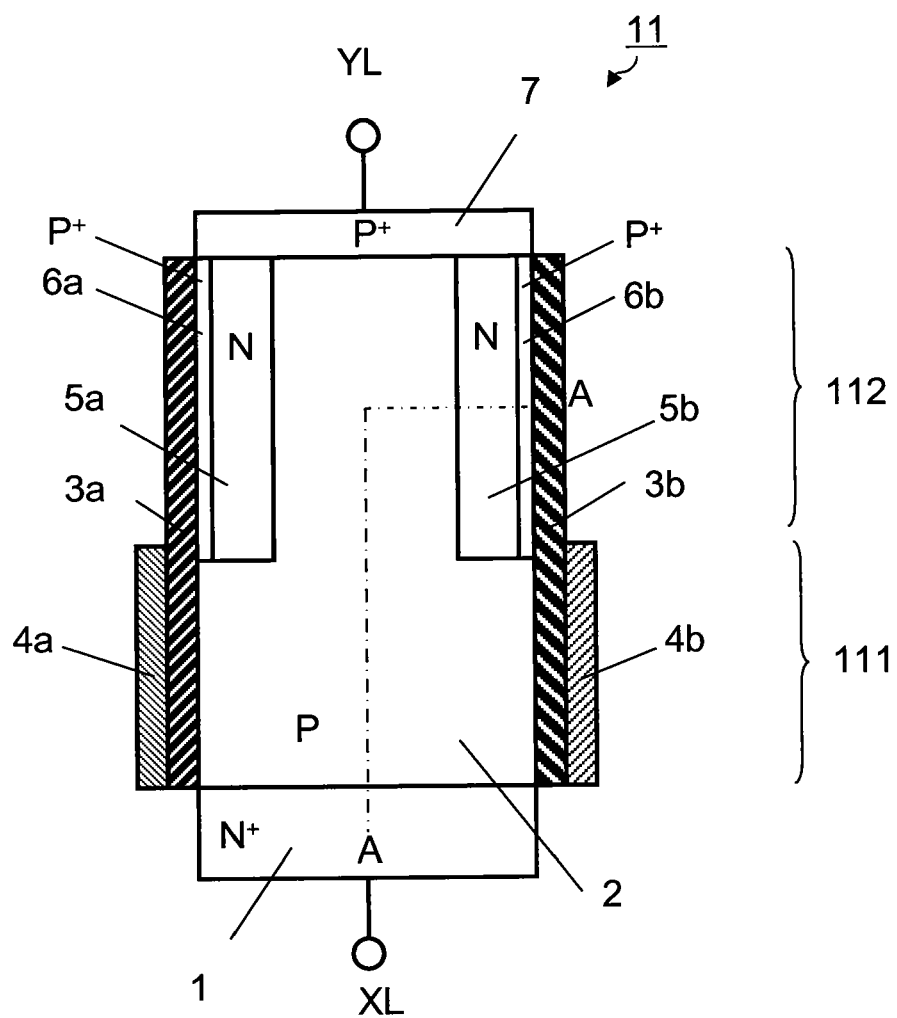
FIG. 1A is an illustration showing the pixel structure of a solid state imaging device according to Embodiment 1 of the present invention.

FIG. 1A shows the pixel structure of the solid state imaging device 100 according to Embodiment 1. An individual pixel 11 has a first semiconductor $N^+$ layer 1 formed on a substrate and the first semiconductor $N^+$ layer 1 is connected to a wire XL extending in a first scanning direction. A MOS transistor 111 comprising a second semiconductor P layer 2 having an opposite conductivity type, insulating film 3a, 3b, and gate conductor layer 4a, 4b is formed on the first semiconductor $N^+$ layer 1. A photodiode 112 consisting of the second semiconductor P layer 2 and a third semiconductor layer 5a, 5b is formed to join to the MOS transistor 111. A fourth semiconductor $P^+$ layer 6a, 6b is formed on the surface of the photodiode 112. A fifth semiconductor $P^+$ layer 7 is formed to join to the fourth semiconductor $P^+$ layer 6a, 6b. The fifth semiconductor $P^+$ layer 7 is connected to a wire YL extending in the direction orthogonal to the first scanning direction. At least the region where the photodiode 112 is formed (the upper region of the second semiconductor P layer 2 where the third semiconductor N layer 5a, 5b is formed and the third semiconductor N layer 5a, 5b), fourth semiconductor $P^+$ layer 6a, 6b, and fifth semiconductor $P^+$ layer 7 are formed in the shape of an island. In this embodiment, the wire XL is a signal line and the wire YL is a pixel selection line. However, the combination of the wires XL and YL can be allowed to be a pixel selection line and a signal line, respectively.

Figure 1B:
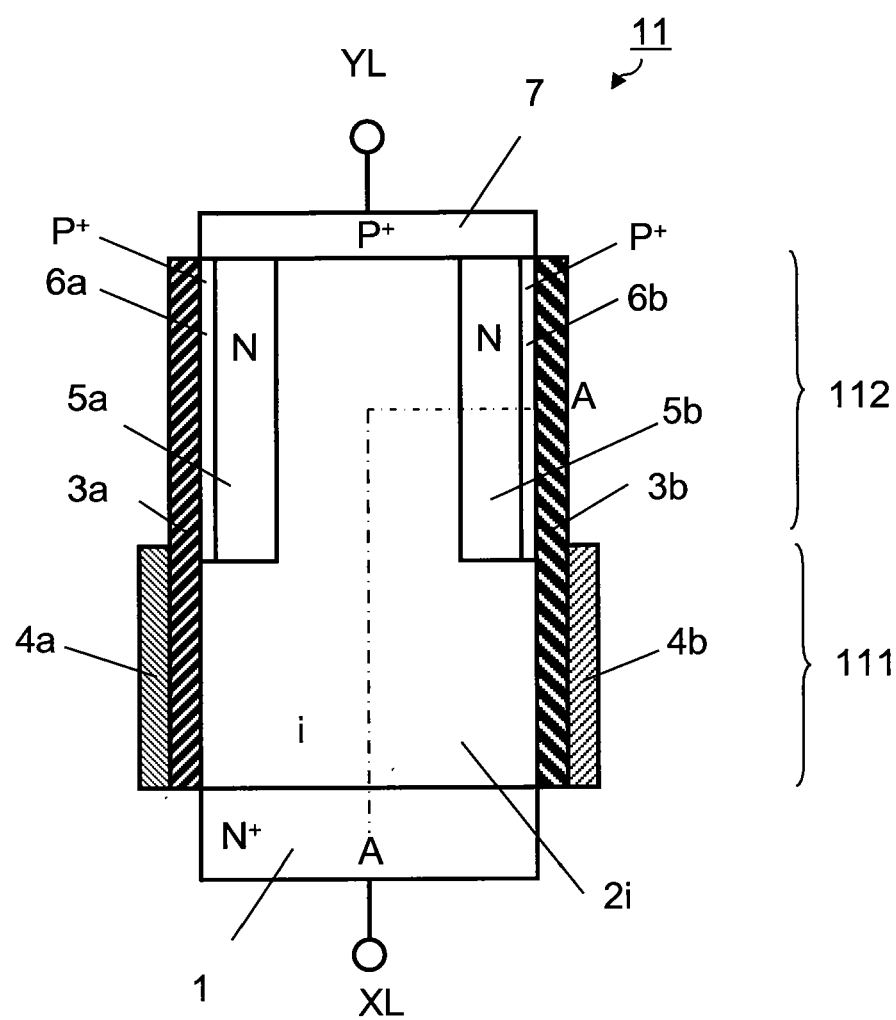
FIG. 1B is an illustration showing the pixel structure of a solid state imaging device according to a modified example of Embodiment 1 of the present invention.

In Embodiment 1, the second semiconductor layer is a P layer 2 made of a P type conductivity semiconductor. However, as illustrated in FIG. 1B, an i layer 2i made of an intrinsic type semiconductor layer can be used instead of the P layer 2. An intrinsic semiconductor is a semiconductor made of substantially a single element. Although an intrinsic semiconductor is made without including impurities, it is inevitable that a tiny amount of impurity exists. As long as the intrinsic semiconductor layer containing an i layer 2i does not impede the function of the solid state imaging device 100, it can contain a small amount of acceptor or donor impurity. With this type of configuration, a photodiode can be formed by the third semiconductor N layers 5a, 5b and the second semiconductor i layer 2i. When sufficient voltage is applied between the fifth semiconductor $P^+$ layer 7 and the signal line $N^+$ layer 1, the fifth semiconductor $P^+$ layer 7 hole flows towards the signal line $N^+$ layer 1 according to the potential gradient generated within the second semiconductor i layer 2i. In this way, the second semiconductor i layer 2i functions as a junction transistor channel similarly to the second semiconductor P layer 2 in FIG. 1A.

Figure 2:
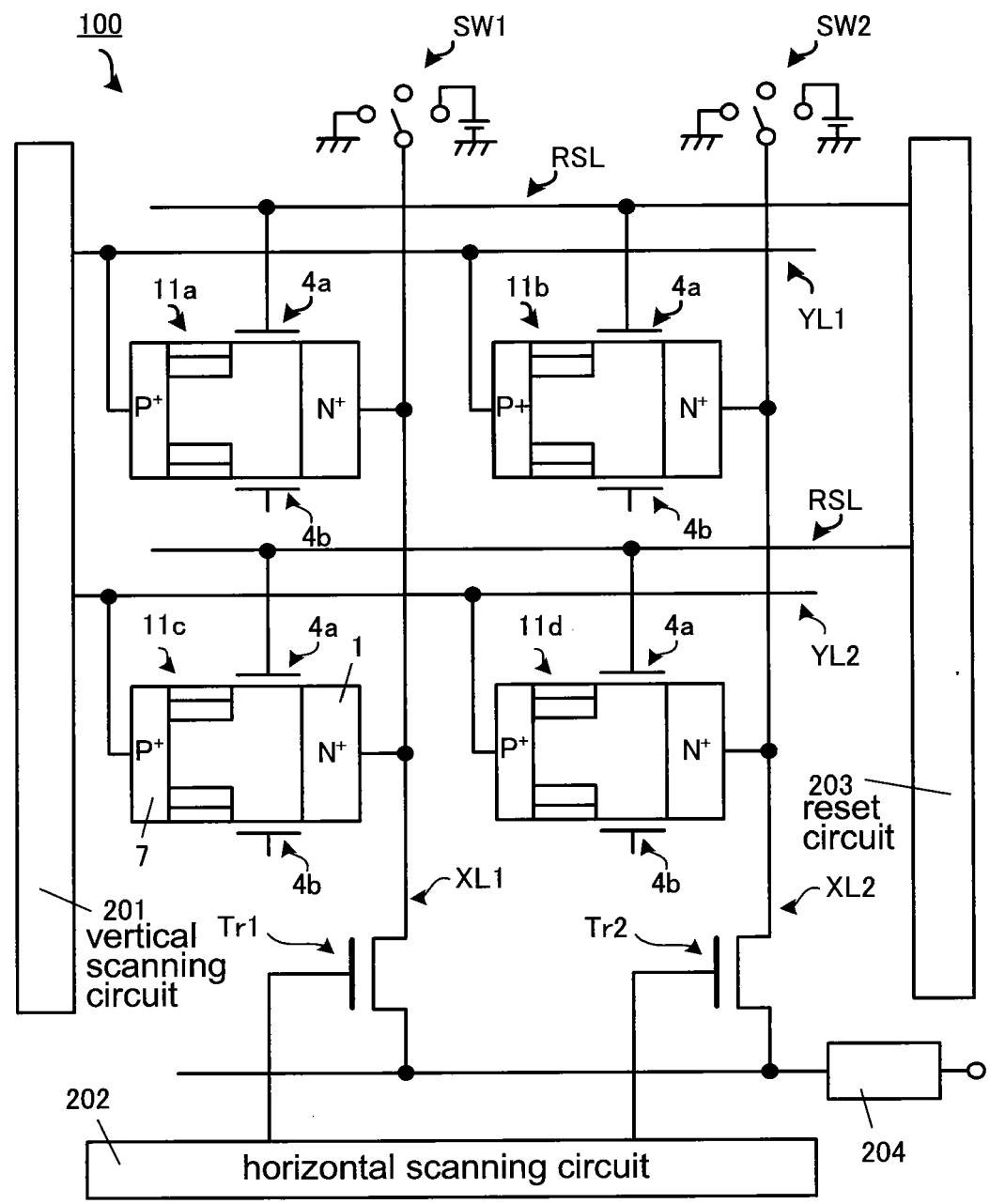
FIG. 2 is an illustration showing the circuit configuration of a solid state imaging device according to Embodiment 1.

FIG. 2 shows an exemplary circuit configuration of the solid state imaging device 100 according to this embodiment. The solid state imaging device 100 primarily comprises multiple pixels 11a to 11d arranged in a two-dimensional matrix, a vertical scanning circuit 201, a horizontal scanning circuit 202, a reset circuit 203, pixel selection lines YL1 and YL2, signal lines XL1 and XL2, reset lines RSL, signal line MOS transistors Tr1 and Tr2, and a correlated double sampling (CDS) output circuit 204. This embodiment will be described as a case in which the pixels are arranged in two rows and two columns. However, the solid state imaging device of the present invention is not restricted to this case.

As shown in FIG. 2, the vertical scanning circuit 201 supplying pixel selection signals to the pixels 11a to 11d are connected to the pixels 11a to 11d via the pixel selection lines YL1 and YL2 on a row basis. The pixels 11a to 11d are also connected to the CDS output circuit 204 via the signal lines XL1 and XL2 on a column basis. The gate electrodes of the signal line MOS transistors Tr1 and Tr2 arranged on the individual signal lines are connected to the horizontal scanning circuit 202 supplying signals for selecting signal lines to these gate electrodes. The signal lines XL1 and XL2 are also connected to switching parts SW1 and SW2, respectively. The gate conductor layers 4a, 4b of the MOS transistors 111 for reset operation are connected to the reset circuit 203 supplying reset signals to the gate conductor layers 4a, 4b via the reset lines RSL. With operation of the above circuit configuration, the signal currents of the pixels 11a to 11d are read from the CDS output circuit 204 in sequence.

Basic operation of the solid state imaging device 100 according to this embodiment will be described hereafter with reference to FIGS. 2 to 4. In the potential profiles of FIGS. 3 and 4, the accumulated signal charges are shown by hatching for distinction.

The basis operation of the solid state imaging device 100 comprises signal charge accumulation, signal reading, and reset. In the signal charge accumulation operation, signal charges generated by light irradiation are accumulated in the third semiconductor N layer 5a, 5b and the second semiconductor P layer 2 near the third semiconductor N layer 5a, 5b ("the photodiode region" hereafter). In the signal reading operation, a current running between the second semiconductor P layer 2 near the first semiconductor N+ layer 1 and the fifth semiconductor P+ layer 7 is measured so that the accumulated signal charge (packets) are measured. The current running between the second semiconductor P layer 2 near the first semiconductor N+ layer 1 and the fifth semiconductor P+ layer 7 varies according to the signal charge (packets) accumulated in the photodiode region. Therefore, the accumulated signal charge packets can be measured by measuring this current. In the reset operation, an ON voltage is applied to the gate conductor layer 4a, 4b of the MOS transistor 111 to create a channel between the first semiconductor N+ layer 1 and the third semiconductor N layer 5a, 5b. Consequently, the signal charges accumulated in the photodiode region are discharged to the first semiconductor N+ layer 1 and removed from the photodiode.

Figure 3A:
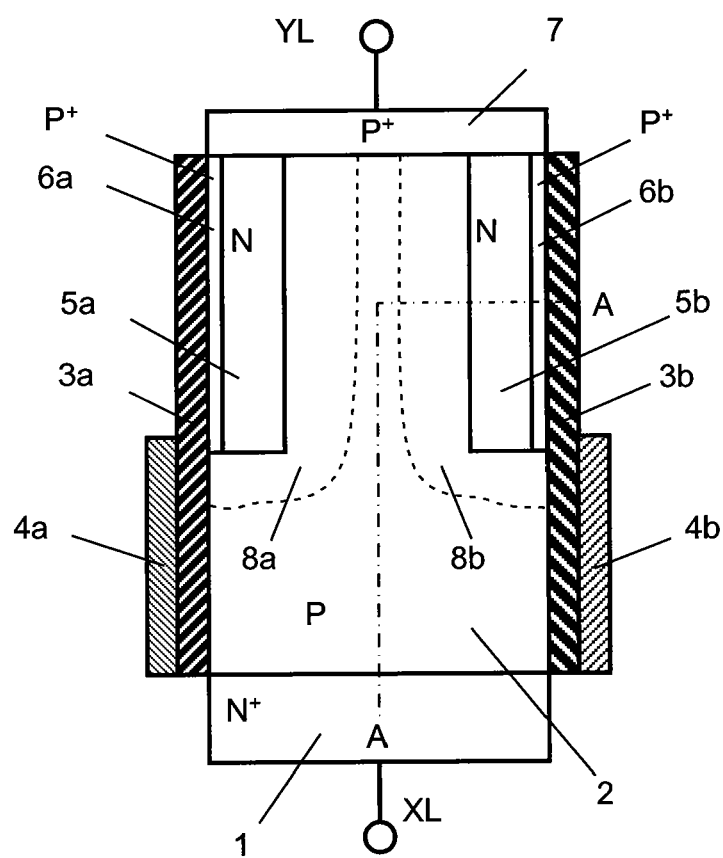
FIG. 3A is an illustration showing a pixel structure for explaining Embodiment 1.

FIG. 3A is a schematic illustration showing the pixel structure when no signal charge is accumulated in the photodiode region during the signal reading. Here, the photodiode 112 has depleted layer 8a, 8b as marked by broken lines. In this embodiment, when no signal charge is accumulated in the photodiode region, the depleted layer 8a, 8b of the photodiode 112 is formed in a part of the upper region of the second semiconductor P layer 2 where the photodiode 112 is formed.

Figure 3B:
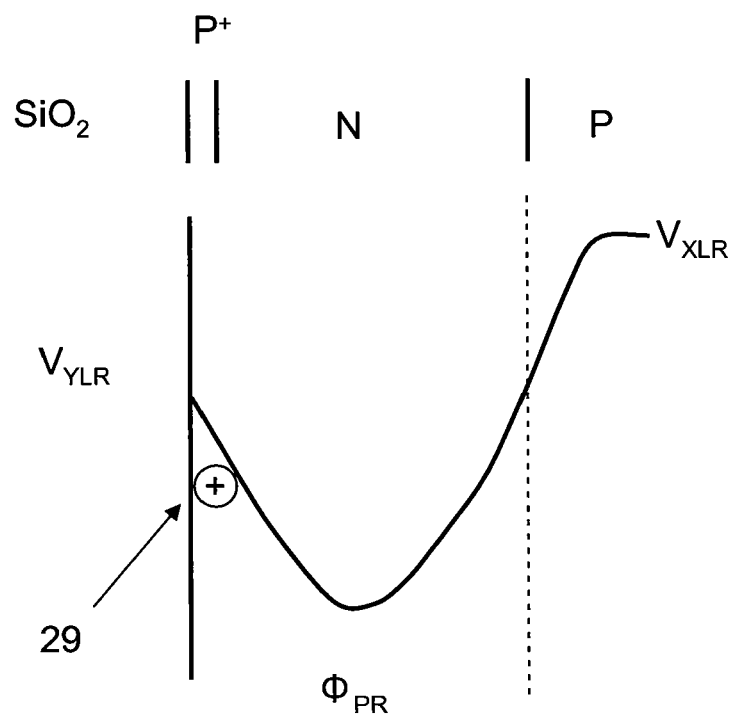
FIG. 3B is an illustration showing a potential profile for explaining Embodiment 1.

FIG. 3B shows the potential profile along the line A-A in FIG. 3A. During the signal reading, the potentials are set so that they become deeper in the following order: the potential of the first semiconductor N+ layer 1 ($V_{XLR}$), the potential of the fifth semiconductor P+ layer 7 ($V_{YLR}$), and the deepest potential $\Phi_{PR}$ in the third semiconductor N layer 5a, 5b when no signal charge is accumulated. Signal charges in this embodiment consist of electrons. Therefore, the potentials are set to satisfies the relationship $\Phi_{PR} > V_{YLR} > V_{XLR}$.

The photodiode surface P+ layer (the fourth semiconductor P+ layer) 6a, 6b are electrically connected to the fifth semiconductor P+ layer 7; therefore, the photodiode surface P+ layer 6a, 6b is at a potential $V_{YLR}$. Holes 29 are supplied from the fifth semiconductor P+ layer 7 and accumulated in the photodiode surface P+ layer 6a, 6b.

Figure 3C:
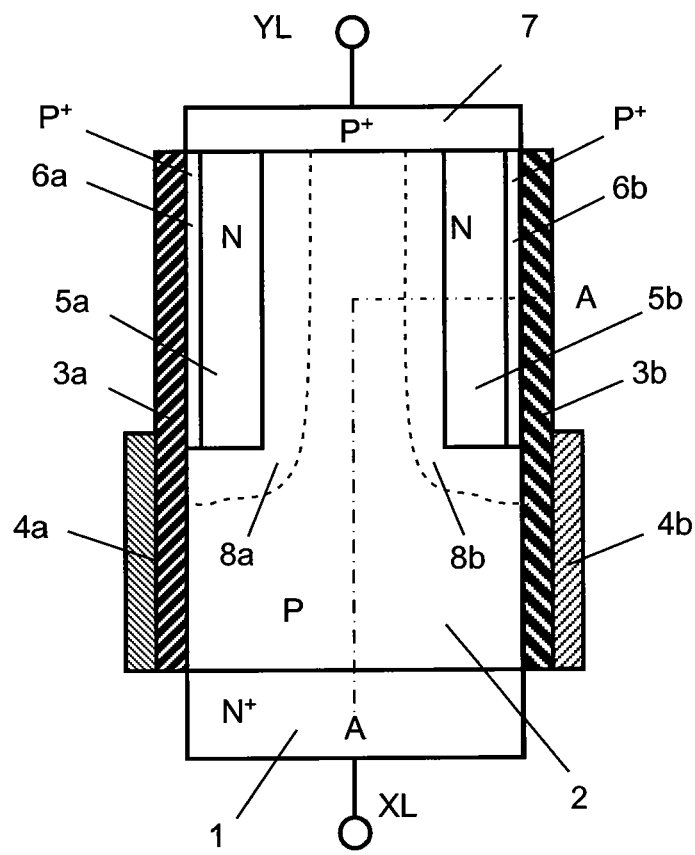
FIG. 3C is an illustration showing a pixel structure for explaining Embodiment 1.
Figure 3D:
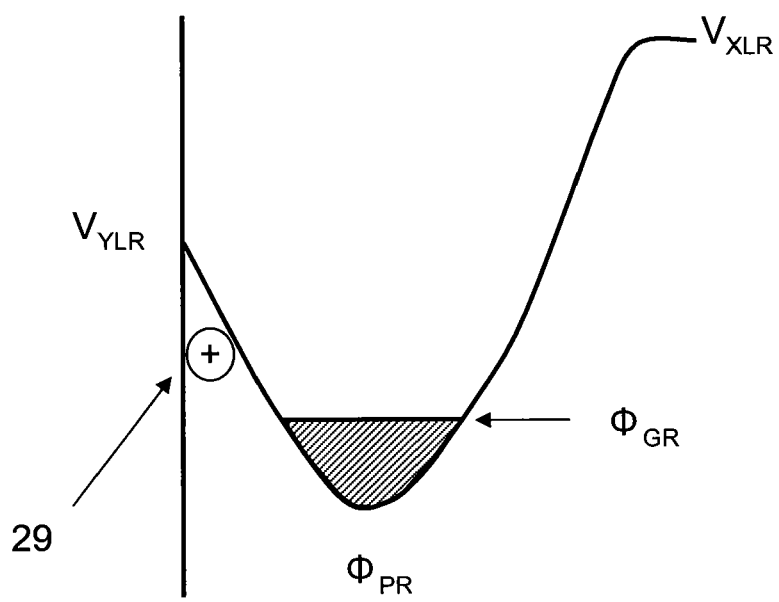
FIG. 3D is an illustration showing a potential profile for explaining Embodiment 1.

FIG. 3C is an illustration showing the pixel structure when signal charges are accumulated in the photodiode region during the signal reading. FIG. 3D shows the potential profile along the line A-A in FIG. 3C. During the signal reading, as shown in FIG. 3D, signal charges are accumulated in the photodiode region and the photodiode potential $\Phi_{GR}$ is changed according to the accumulated signal charges. Then, as shown in FIG. 3C, the width of the depleted layer 8a, 8b is decreased according to the photodiode potential $\Phi_{GR}$ created by the accumulated signal charges. Subsequently, the width of the second semiconductor P layer 2 serving as the channel of an amplifying junction transistor is changed. Accordingly, the current running between the second semiconductor P layer 2 near the first semiconductor N+ layer 1 and the fifth semiconductor P+ layer 7 is changed.

Figure 3E:
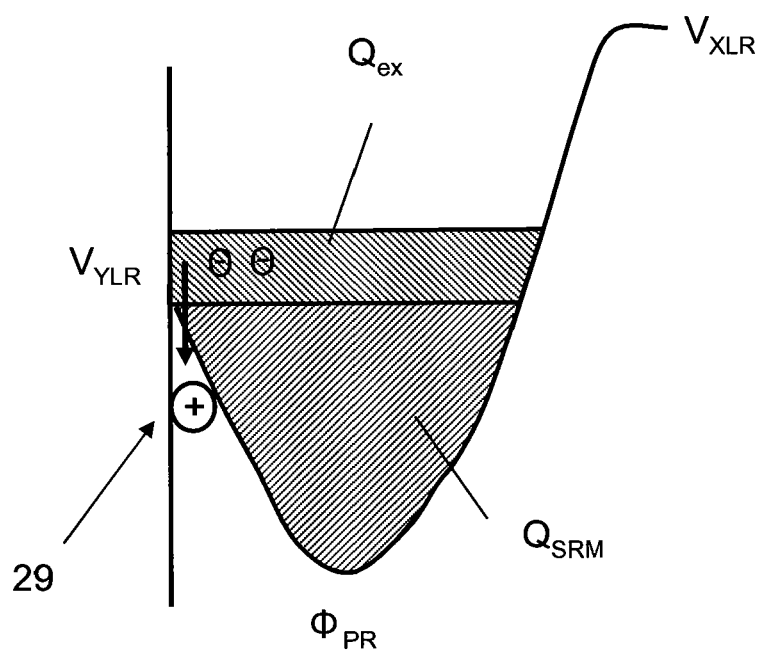
FIG. 3E is an illustration showing a potential profile for explaining Embodiment 1.

FIG. 3E is a schematic illustration showing the potential profile along the line A-A in FIG. 3C when signal charges are further accumulated and excessive signal charge (packets) $Q_{ex}$ are accumulated in the photodiode region as accumulated signal charges in addition to the reading maximum signal charge (packets) $Q_{SRM}$ during the signal reading. In this embodiment, signal charges are accumulated in the photodiode region until the photodiode potential $\Phi_{GR}$ becomes $V_{YLR}$. The excessive signal charge (packets) $Q_{ex}$ due to extra light irradiation are recoupled to the holes 29 accumulated in the photodiode surface P+ layer 6a, 6b and disappear. In this embodiment, the potential relationship $V_{XLR} < V_{YLR}$ is set; therefore, the excessive signal charge (packets) $Q_{ex}$ do not migrate to the second semiconductor P layer 2. Consequently, excessive signal charges generated in the photodiode region by light irradiation can be removed without forming a drain particularly for removing excessive signal charges. Therefore, no excessive signal charges intrude into the channel of the amplifying junction transistor.

Figure 4A:
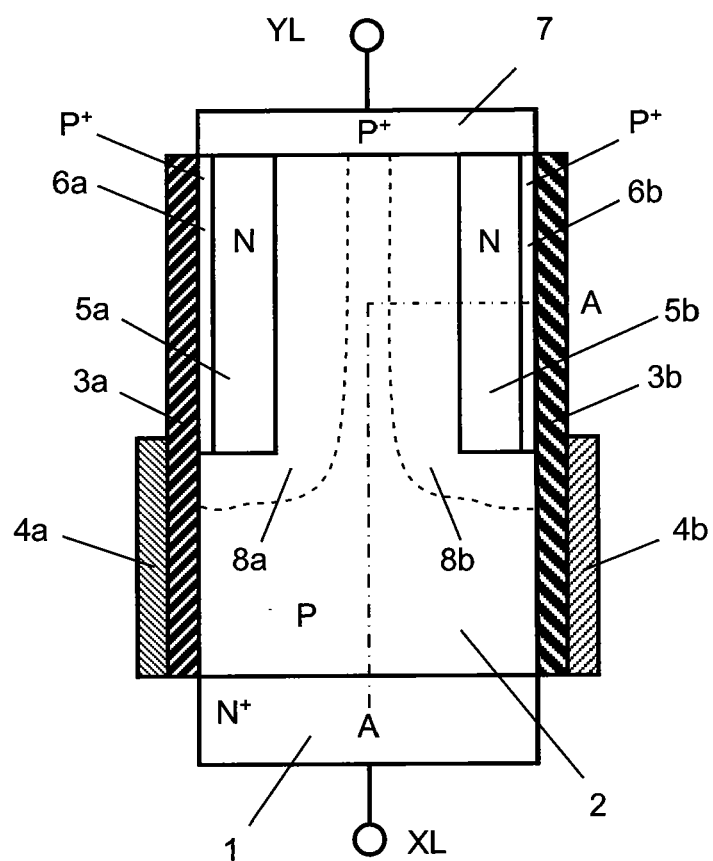
FIG. 4A is an illustration showing a pixel structure for explaining Embodiment 1.

FIG. 4A is a schematic illustration showing the pixel structure including the depleted layers 8a and 8b when no signal charge is accumulated in the photodiode region during the signal charge accumulation. In this embodiment, when no signal charge is accumulated in the photodiode region, the depleted layer 8a, 8b of the photodiode 112 are formed in a part of the upper region of the second semiconductor P layer 2.

Figure 4B:
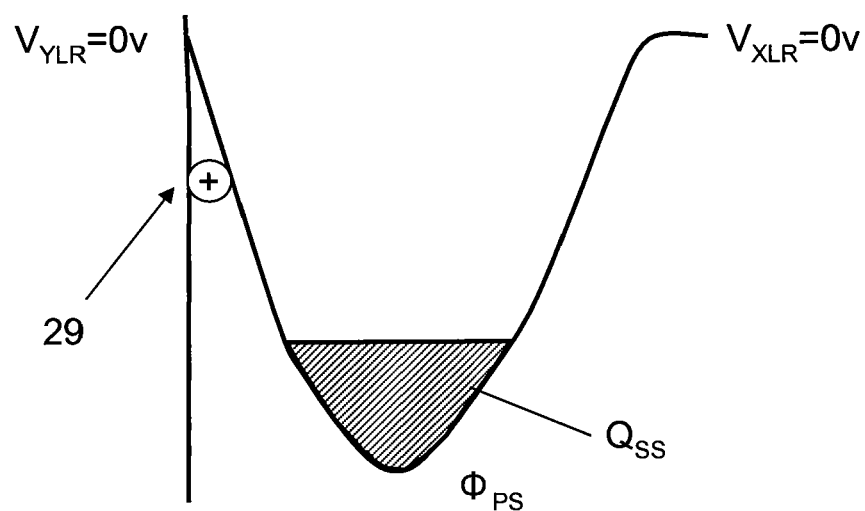
FIG. 4B is an illustration showing a potential profile for explaining Embodiment 1.

FIG. 4B shows the potential profile at the line A-A in FIG. 4A. For example, the potential $V_{XLR}$ of the first semiconductor N+ layer 1 is set to 0 V, the potential $V_{YLR}$ of the fifth semiconductor P+ layer 7 is set to 0 V, and the potential of the gate conductor layer 4a, 4b of the MOS transistor 111 is set to 0 V during the signal charge accumulation. In this way, the accumulated signal charge (packets) $Q_{SS}$ are accumulated in the photodiode region according to light irradiation as shown in FIG. 4B. If the accumulated signal charge packets $Q_{SS}$ are larger than the reading maximum signal charge packets $Q_{SRM}$, excessive charges are recombined to the holes 29 accumulated in the fourth semiconductor P+ layer 6a, 6b and removed as described above upon transition to the signal reading operation.

Figure 4C:
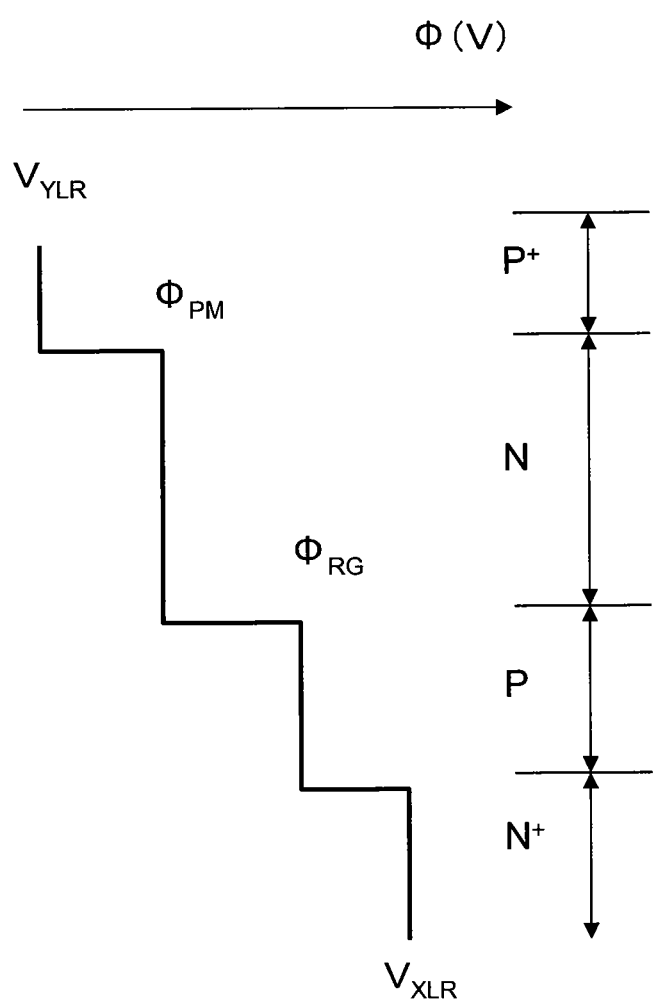
FIG. 4C is an illustration showing a potential profile for explaining Embodiment 1.

FIG. 4C shows the potential profile at the line A-A in FIG. 1 during the reset. In the reset operation, the potentials are set so that they become deeper in the following order: the potential of the fifth semiconductor P+ layer 7 ($V_{YLR}$), the deepest potential $\Phi_{PM}$ in the third semiconductor N layers 5a and 5b when no signal charge is accumulated, the potential $\Phi_{RG}$ of the channel of the MOS transistor of the second semiconductor P layer 2 when an ON voltage is applied to the gate conductor layers 4a and 4b of the MOS transistor 111, and the potential of the first semiconductor N+ layer 1 ($V_{XLR}$). In this embodiment, the signal charges consist of electrons; the potentials are set to satisfy the relationship $V_{YLR} < \Phi_{PM} < \Phi_{RG} < V_{XLR}$. For example, $V_{YLR} = 0$ V, $V_{XLR} = 2$ V, and the voltage of the gate conductor layers 4a and 4b is 1.5 V. In this way, during the reset, the signal charges accumulated in the photodiode region do not stay in the photodiode region. Migrating to the first semiconductor N+ layer 1, the all signal charges are removed.

Figure 24A:
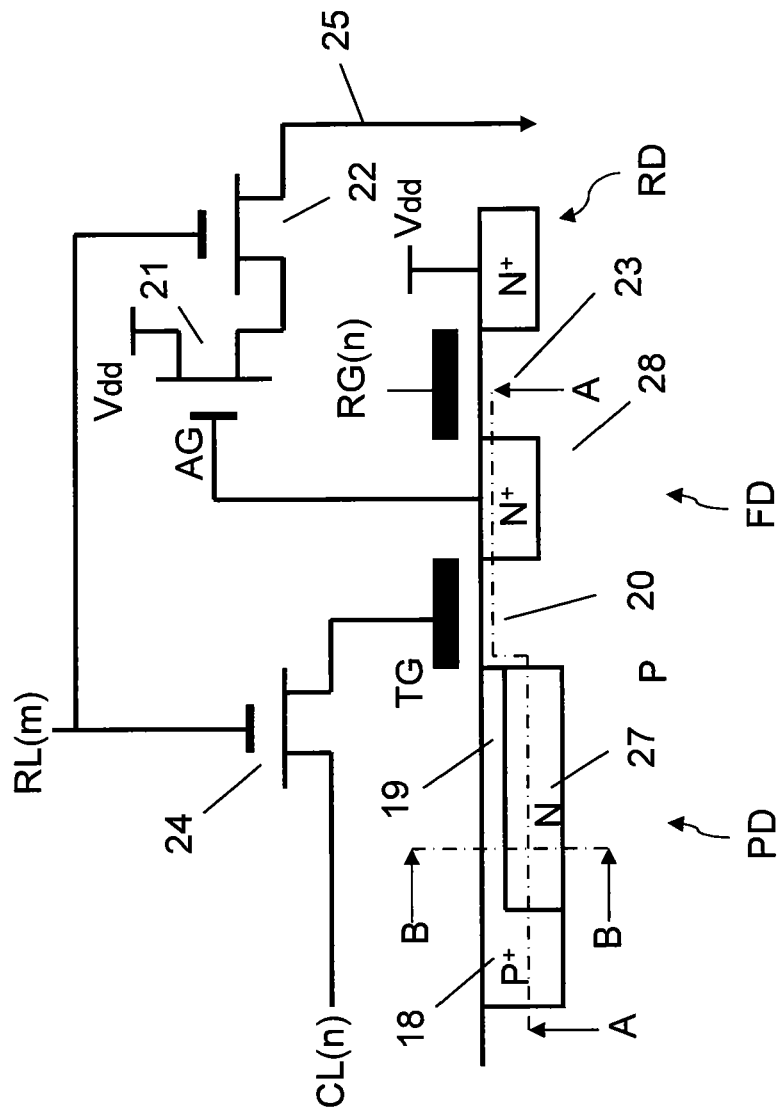
FIG. 24A is an illustration showing a pixel structure for explaining a prior art solid state imaging device and its operation.
Figure 24B:
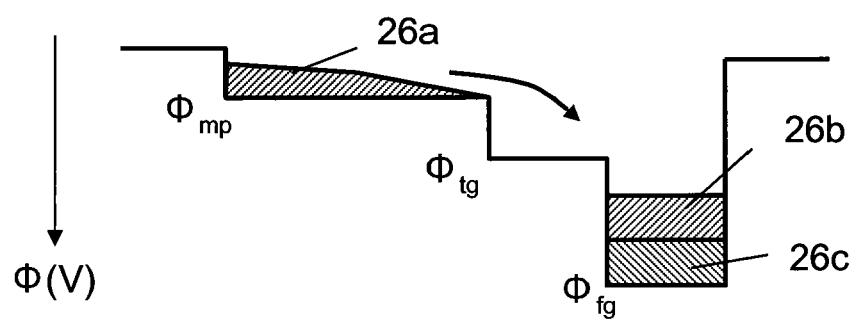
FIG. 24B is an illustration showing a potential profile for explaining a prior art solid state imaging device and its operation.
Figure 24C:
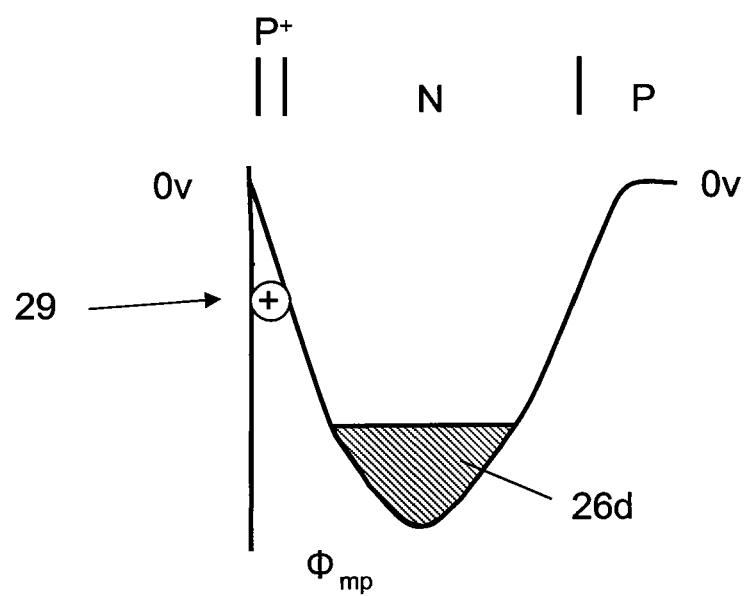
FIG. 24C is an illustration showing a potential profile for explaining a prior art solid state imaging device and its operation.
Figure 25:
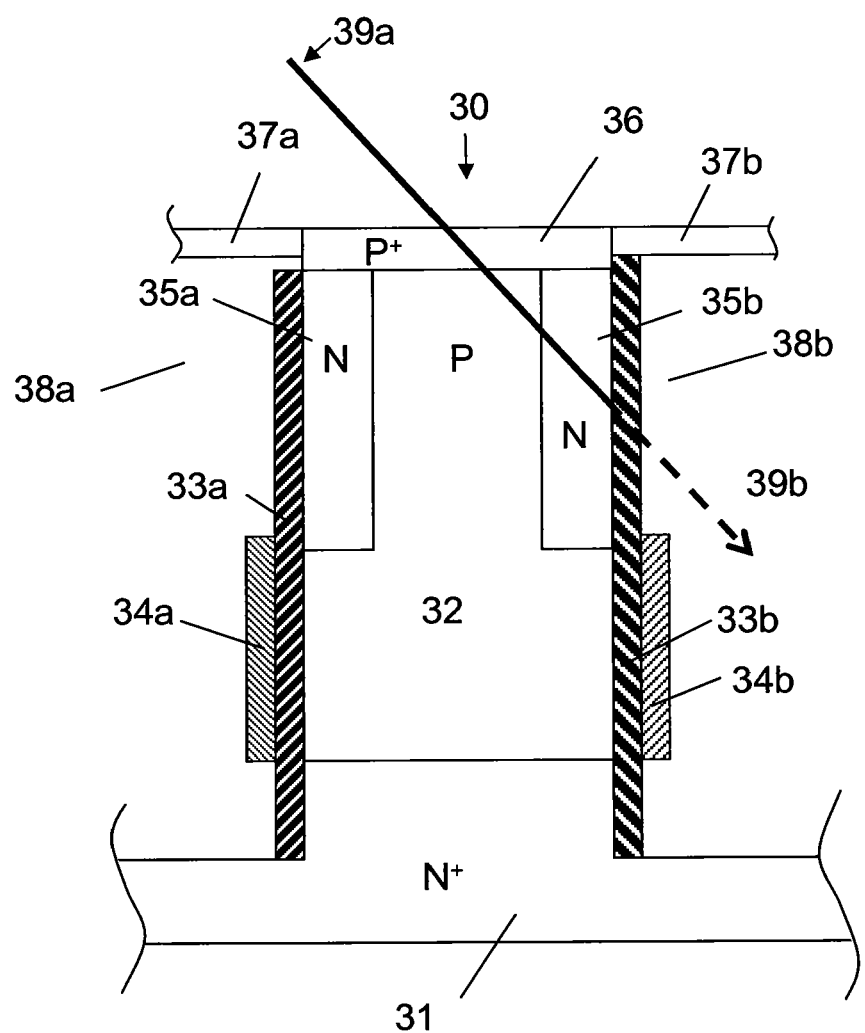
FIG. 25 is an illustration showing a pixel structure for explaining a second prior art solid state imaging device

Consequently, residual images and kTC noise are prevented in the solid state imaging device shown in FIG. 24A.

Embodiment 2

Figure 5A:
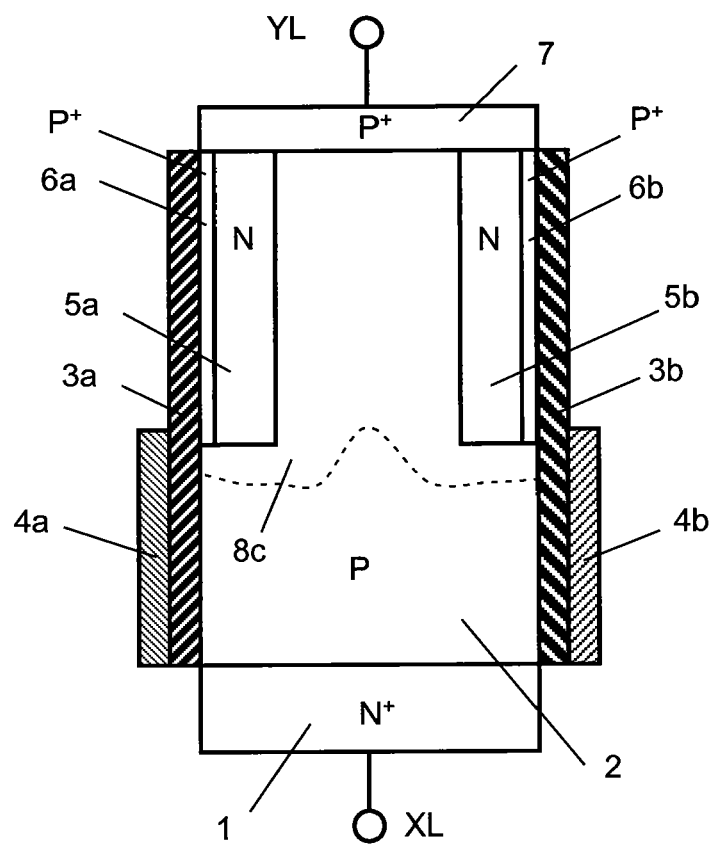
FIG. 5A is an illustration showing the pixel structure of a solid state imaging device according to Embodiment 2 of the present invention.
Figure 5B:
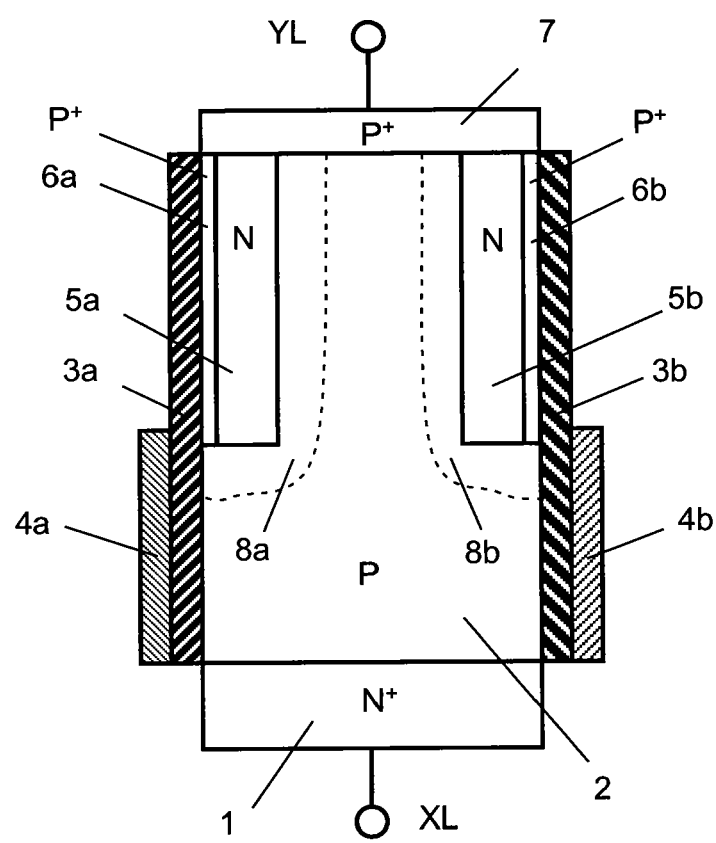
FIG. 5B is an illustration showing a pixel structure for explaining Embodiment 2.
Figure 5C:
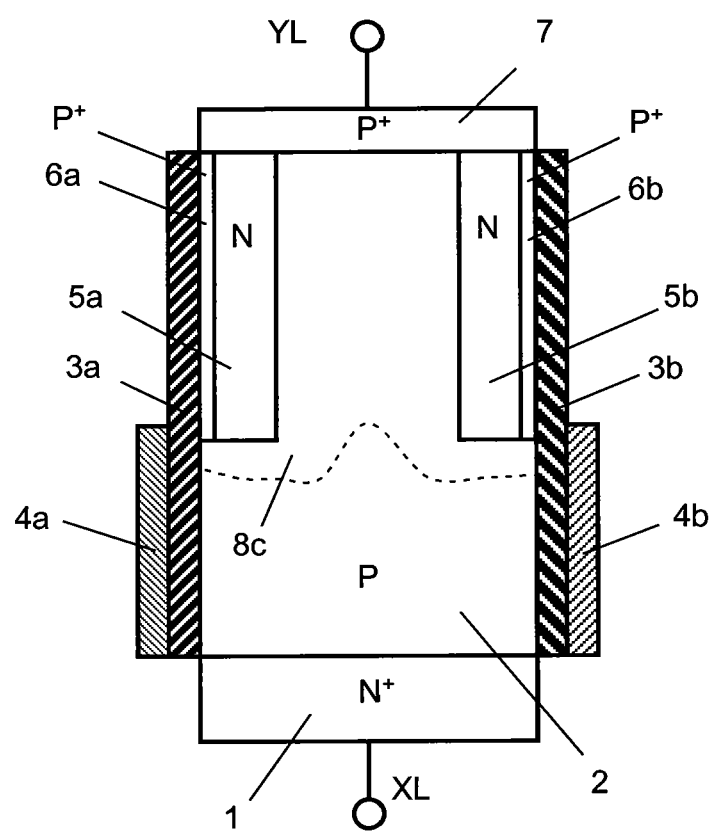
FIG. 5C is an illustration showing a pixel structure for explaining Embodiment 2.

FIGS. 5A to 5C are schematic illustrations of a pixel structure for explaining a solid state imaging device according to Embodiment 2 of the present invention. The same components as those of the solid state imaging device according to Embodiment 1 are referred to by the same reference numbers.

This embodiment is different from Embodiment 1 in that the depleted layer 8c of the diode occupies the upper region of the second semiconductor P layer 2 where the photodiode 112 is formed when no signal charge is accumulated in the photodiode region as shown in FIG. 5A. Such a photodiode 112 is formed by properly adjusting the thicknesses and impurity concentrations of the third semiconductor N layer 5a, 5b and second semiconductor P layer 2.

No channel is formed for running a current between the fifth semiconductor P⁺ layer 7 and the second semiconductor P layer 2 near the first semiconductor N⁺ layer 1 of the amplifying junction transistor when the depleted layer 8c occupies the upper region of the second semiconductor P layer 2.

When signal charges are accumulated in the photodiode region, during the signal reading, the width (thickness) of the depleted layer 8a, 8b of the photodiode 112 is decreased as shown in FIG. 5B. Therefore, the channel of the amplifying junction transistor is formed in the second semiconductor P layer 2, and a current according to the accumulated charges runs through the channel.

FIG. 5C is a schematic illustration showing the pixel structure including the depleted layer 8c when no signal charge is accumulated in the photodiode region during the signal charge accumulation. During the signal charge accumulation, for example, the voltage $V_{XLR}$ of the first semiconductor N⁺ layer 1 is set to 0 V and the voltage $V_{YLR}$ of the fifth semiconductor P⁺ layer 7 is set to 0 V in a general practice.

As shown in FIG. 5C, the depleted layer 8c of the photodiode 112 occupies the upper region of the second semiconductor P layer 2 when no signal charge is accumulated during the signal charge accumulation. The second semiconductor P layer 2 that is not occupied by the depleted layer 8c allows signal charges generated in the second semiconductor P layer 2 to diffuse to and reach the fifth semiconductor P⁺ layer 7 or first semiconductor N⁺ layer 1. Consequently, the signal charges generated in the second semiconductor P layer 2 do not contribute to signals. On the other hand, the depleted layer 8c occupying the upper region of the second semiconductor P layer 2 contributes to effective capture and accumulation of generated signal charges in the photodiode 112 particularly when a small quantity of light is irradiated.

Furthermore, when no signal charge is accumulated, the amplifying junction transistor channel is pinched off. Therefore, for example, the depleted layer 8c serves to prevent injection of the holes 29 from the fifth semiconductor P⁺ layer 7 to the second semiconductor P layer 2 as a result of noise leaping to the pixel selection line YL other than during the signal reading.

As described above, during the signal reading, the depleted layer 8c of the photodiode 112 occupies the upper region of the second semiconductor P layer 2 when no signal charge is accumulated in the photodiode region, providing a solid state imaging device having an excellent low irradiation property.

Embodiment 3

Figure 6:
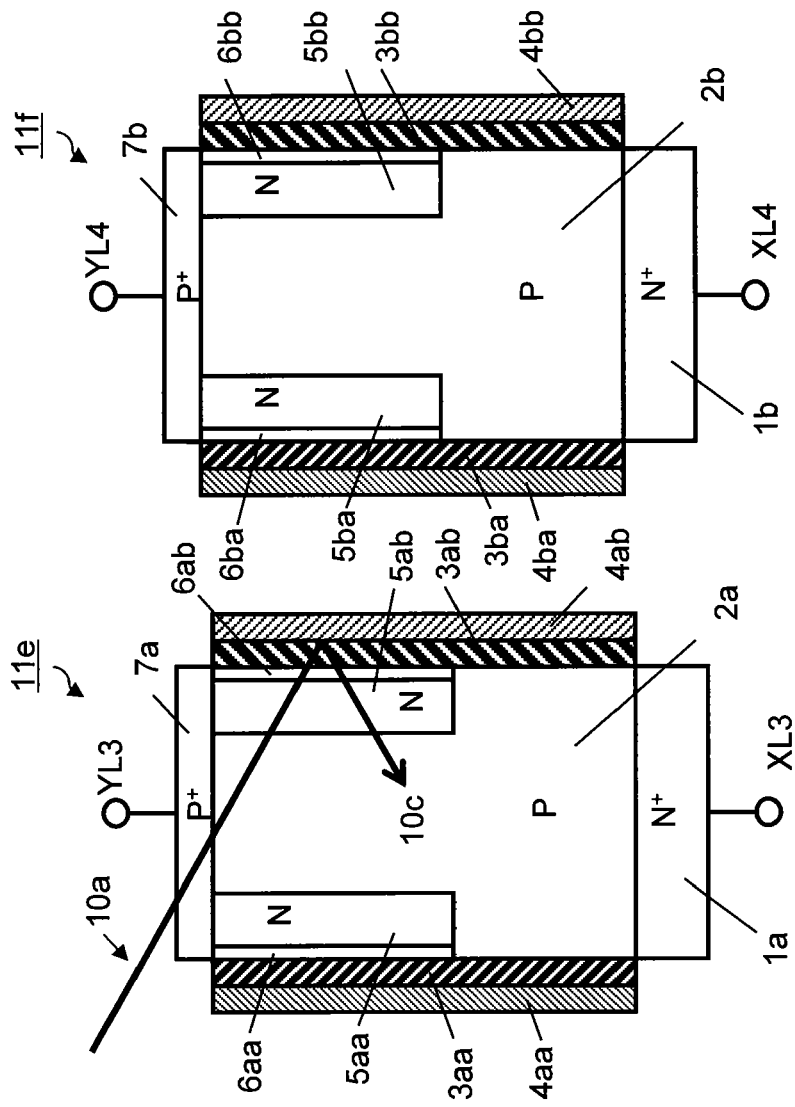
FIG. 6 is an illustration showing the pixel structure of a solid state imaging device according to Embodiment 3 of the present invention.

FIG. 6 is a cross-sectional view of two pixels for explaining a solid state imaging device according to Embodiment 3 of the present invention. The same components as those of the solid state imaging device according to Embodiment 1 are referred to by the same reference numbers. The components of a pixel 11e are referred to by reference numbers with a suffix aa or ab and the components of a pixel 11f are referred to by reference numbers with a suffix ba or bb. In the solid state imaging devices in Embodiments 1 and 2, the gate conductor layer 4a, 4b of the reset MOS transistor 111 is formed only on the channel of the MOS transistor 111. On the other hand, in the solid state imaging device according to this embodiment, gate conductor layers 4aa, 4ab, 4ba, and 4bb of the reset MOS transistors 111 are extended to cover photodiode surface P+ layers (the fourth semiconductor P⁺ layers) 6aa, 6ab, 6ba, and 6bb. Here, the gate conductor layers 4aa, 4ab, 4ba, and 4bb enclose the pixel (island-shaped semiconductor) 11e and 11f, respectively. The gate conductor layers 4aa, 4ab, 4ba, and 4bb are made of, for example, a light-blocking conductive material such as polysilicon and metal, and absorb or reflect irradiated light.

Light (incident light) 10a entering the first pixel 11e from the front surface of the pixel (the top surface in FIG. 6) at an angle partly reaches the adjacent second pixel 11f and generates signal charges in the above-described pixel structure according to Embodiment 1. This means that the signal charges originally to be generated in the first pixel 11e leak into the adjacent pixel. Leakage of signal charges into an adjacent pixel may cause deteriorated resolution and mixed color particularly in a color imaging device in which each pixel is supposed to receive a predetermined color light. Deteriorated resolution and mixed color particularly in color imaging may lead to significant deterioration in image quality.

On the other hand, in this embodiment, the oblique incident light 10a is absorbed or reflected by the gate conductor layers 4aa, 4ab, 4ba, and 4bb made of a light-blocking material. The reflected light 10c stays in the initial pixel 11e and the above mentioned leakage of signal charges into the adjacent pixel 11f does not occur.

In this embodiment, the photodiode surface P⁺ layers 6aa, 6ab, 6ba, and 6bb are joined to the fifth semiconductor P⁺ layers 7a and 7b to which the voltage of the second wires YL3 and YL4 are applied. Therefore, the potential of the photodiode surface P⁺ layers 6aa, 6ab, 6ba, and 6bb is fixed to the potential of the second wires YL3 and YL4. Because of the shield effect of the photodiode surface P⁺ layers 6aa, 6ab, 6ba, and 6bb, the photodiode potential changing the channel width of the amplifying junction transistor is less affected by change with time of the potential of the gate conductor layers 4aa, 4ab, 4ba, and 4bb of the reset MOS resistor, ensuring stable operation.

Embodiment 4

Figure 7:
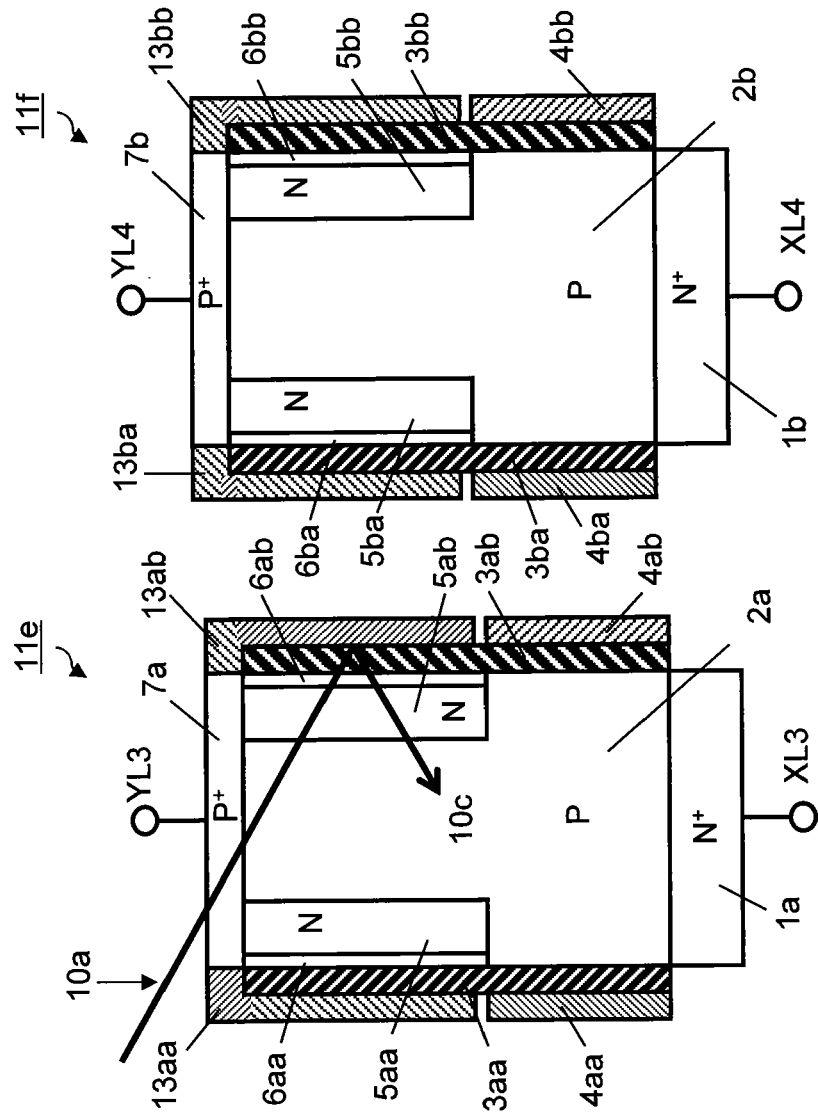
FIG. 7 is an illustration showing the pixel structure of a solid state imaging device according to Embodiment 4 of the present invention.

A solid state imaging device according to Embodiment 4 will be described hereafter with reference to FIG. 7. The same components as those of the solid state imaging device according to Embodiment 3 are referred to by the same reference numbers. In the above-described solid state imaging device according to Embodiment 3, the gate conductor layers 4aa, 4ab, 4ba, and 4bb of the reset MOS transistors 111 are extended over the photodiode surface P⁺ layers (the fourth semiconductor P⁺ layers) 6aa, 6ab, 6ba, and 6bb. On the other hand, in the solid state imaging device according to this embodiment, first conductor layers 13aa, 13ab, 13ba, and 13bb joined to the fifth semiconductor P⁺ layers 7a and 7b cover the photodiode surface P⁺ layers 6aa, 6ab, 6ba, and 6bb. The first conductor layers 13aa, 13ab, 13ba, and 13bb enclose the island-shaped semiconductors 11e and 11f, respectively. The first conductor layers 13aa, 13ab, 13ba, and 13bb are comprised of a light-blocking conductive material.

In this way, as in the solid state imaging device according to Embodiment 3, the incident light 10a entering the first pixel 11e from the front surface of the pixel at an angle is absorbed or reflected by the first conductor layers 13aa, 13ab, 13ba, and 13bb or the gate conductor layers 4aa, 4ab, 4ba, and 4bb. The reflected light 10c stays in the initial pixel 11e and no leakage of signal charges into the adjacent pixel 11f occurs.

Furthermore, in the above-described solid state imaging device according to Embodiment 3, the gate conductor layers 4aa, 4ab, 4ba, and 4bb cover the photodiode surface P$^+$ layers 6aa, 6ab, 6ba, and 6bb. Although shielded by the photodiode surface P$^+$ layers 6aa, 6ab, 6ba, and 6bb fixed to the voltage of the wires YL3 and YL4, the photodiode potential changing the channel width of the amplifying junction transistor is easily affected by capacitive coupling following any change in voltage of the gate conductor layers 4aa, 4ab, 4ba, and 4bb of the MOS transistors 111. On the other hand, in the solid state imaging device of this embodiment, the first conductor layers 13aa, 13ab, 13ba, and 13bb covering the photodiode surface are electrically connected to the photodiode surface P$^+$ layers 6aa, 6ab, 6ba, and 6bb, respectively, and equal in potential to the photodiode surface P$^+$ layers 6aa, 6ab, 6ba, and 6bb. Therefore, the potential of the photodiode surface P$^+$ layers 6aa, 6ab, 6ba, and 6bb is less affected by change in voltage other than the wires YL3 and YL4. Consequently, the photodiode potential changing the channel width of the amplifying junction transistor stably operates and the solid state imaging device of this embodiment stably operates.

Embodiment 5

Figure 8:
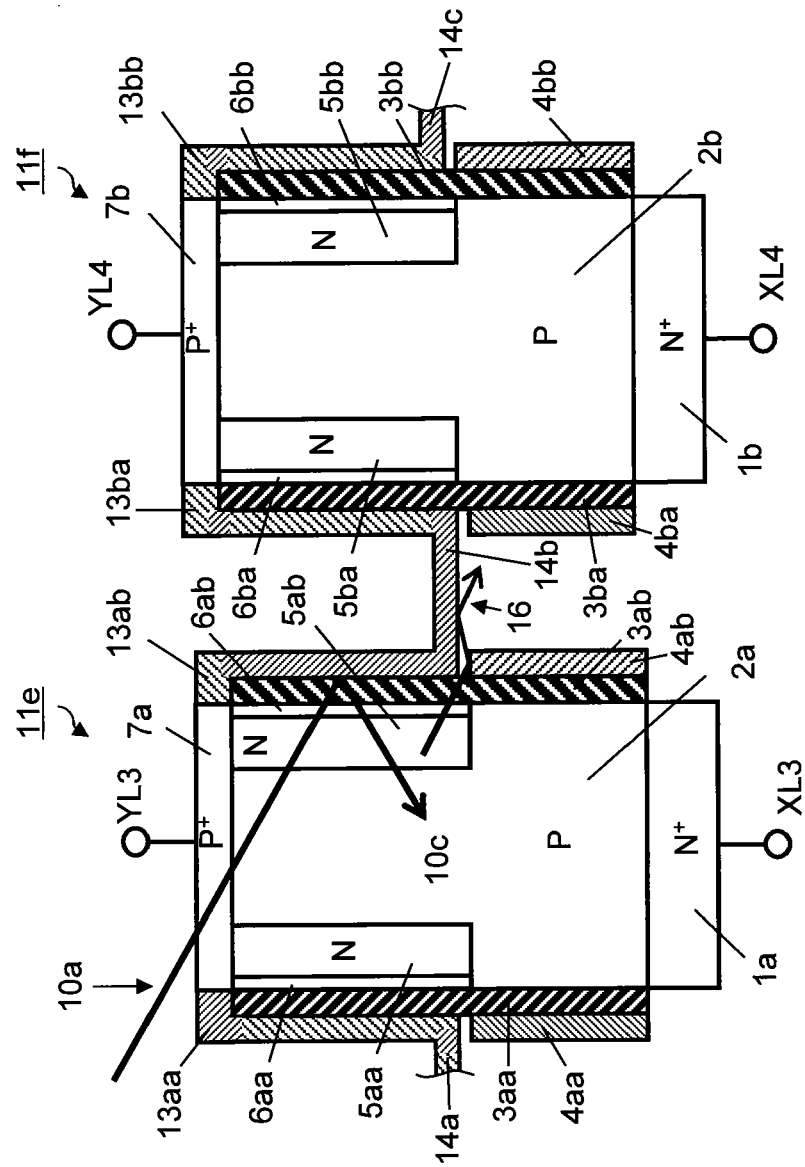
FIG. 8 is an illustration showing the pixel structure of a solid state imaging device according to Embodiment 5 of the present invention.

A solid state imaging device according to Embodiment 5 of the present invention will be described hereafter with reference to FIG. 8. The same components as those of Embodiment 4 are referred to by the same reference numbers. In a conventional two-dimensional solid state imaging device, the pixel selection line, pixel signal line, pixel power supply line, and gate of a pixel MOS transistor of each pixel are connected to a scanning circuit, power circuit, signal processing circuit, gate pulse generation circuit, and the like provided around the solid state imaging device. The connection lines are provided in a first wiring direction or in a second wiring direction. For example, the first semiconductor N$^+$ layers 1a and 1b are connected to signal lines and the fifth semiconductor P$^+$ layers 7a and 7b are connected to pixel selection lines. As shown in FIG. 8, when the signal lines XL3 and XL4 are provided in the vertical direction on the sheet, the pixel selection lines are generally provided in the horizontal direction on the sheet. In this case, the pixel selection lines consist of the first conductor layers 13aa, 13ab, 13ba, and 13bb connecting the fifth semiconductor P$^+$ layers 7a and 7b and the first wiring conductor layers 14a to 14c connecting the first conductor layers 13aa, 13ba, 13ba, and 13bb of adjacent pixels. In this embodiment, the first conductor layers 13aa, 13ab, 13ba, and 13bb are connected to the first conductor layers 13aa, 13ab, 13ba, and 13bb of the adjacent pixels near the gate conductor layers 4aa, 4ab, 4ba, and 4bb of the MOS transistors. Furthermore, the first conductor layers 13aa, 13ab, 13ba, and 13bb and first wiring conductor layers 14a to 14c are made of a light-blocking conductive material. In this embodiment, the first conductor layers 13aa, 13ab, 13ba, and 13bb and the first wiring conductor layers 14a to 14c are integrally formed.

With the above structure, as shown in FIG. 8, as in the solid state imaging devices according to Embodiments 3 and 4, the incident light 10a entering the first pixel 11e from the pixel front surface at an angle is absorbed or reflected by the first conductor layers 13aa, 13ab, 13ba, and 13bb or the gate conductor layers 4aa, 4ab, 4ab, and 4bb. The reflected light 10c stays in the initial pixel 11e and no leakage of signal charges into the adjacent pixel 11f occurs. Furthermore, leakage of the light entering the space between the pixels 11e and 11f into the second semiconductor P layers 2a and 2b through the gap between the first conductor layers 13ab and 13ba joined to the fifth semiconductor P$^+$ layers 7a and 7b, respectively, and the gate conductor layers 4ab and 4ba of the MOS transistors is effectively prevented. As shown in FIG. 8, the light 16 once entering the pixel 11e and emerging from the gap between the first conductor layer 13ab and the gate conductor layer 4ab is absorbed or reflected by the first wiring conductor layer 14b. Therefore, leakage of such light into the second semiconductor P layer 2b of the adjacent pixel 11f through the gap between the first semiconductor layer 13ba and gate conductor layer 4ba of the adjacent pixel 11f is effectively prevented. Unlike this embodiment, if the first conductor layer 13ab is connected to the first conductor layer 13ba connected to the fifth semiconductor P$^+$ layer 7b of the adjacent pixel at the top where a light enters, the light easily leaks into the adjacent pixel by coming around from between the pixel selection lines provided in the horizontal direction or through the gap between the gate conductor layers 4ab and 4ba and the first conductor layers 13ab and 13ba. In the solid state imaging device of this embodiment, the light leakage can effectively be prevented.

Embodiment 6

A solid state imaging device according to Embodiment 6 of the present invention will be described hereafter with reference to FIG. 9. The same components as those of Embodiment 4 are referred to by the same reference numbers. In the solid state imaging device of this embodiment, the gate conductor layers 4aa, 4ab, 4ba, and 4bb of the MOS transistors 111 are provided in the horizontal direction in FIG. 9. Furthermore, the gate conductor layers 4aa, 4ab, 4ba, and 4bb of the pixels 11e and 11f are connected by the second wiring conductor layers 15a to 15c at the upper parts of the MOS transistors. The second wiring conductor layers 15a to 15c are made of a light-blocking conductive material. In this embodiment, the gate conductor layers 4aa, 4ab, 4ba, and 4bb and the second wiring conductor layers 15a to 15c are integrally formed.

Figure 9:
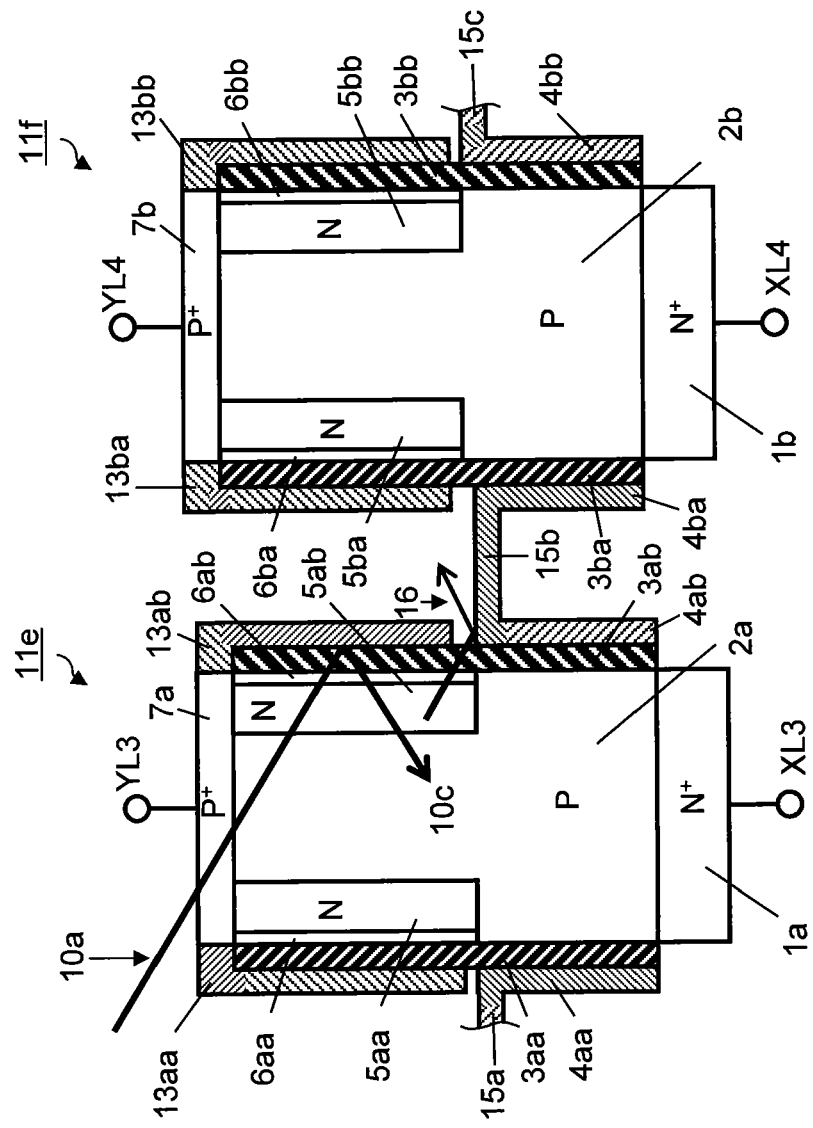
FIG. 9 is an illustration showing the pixel structure of a solid state imaging device according to Embodiment 6 of the present invention.

With the above structure, as shown in FIG. 9, the light 10a entering the first pixel 11e from the front surface of the pixel at an angle is absorbed or reflected by the first conductor layers 13aa and 13ba, or the gate conductor layers 4aa and 4ab, as in the solid state imaging devices of Embodiments 3 to 5. The reflected light 10c stays in the initial pixel 11e and no leakage of signal charges into the adjacent pixel 11f occurs. As in the above-described solid state imaging device according to Embodiment 5, leakage of the light entering the space between the adjacent pixels into the second semiconductor P layers 2a and 2b of the adjacent pixels through the gap between the gate conductor layers 4ab and 4ba and the first conductor layers 13ab and 13ba is effectively prevented. Furthermore, the light 16 once entering the pixel 11e and emerging from the gap between the gate conductor layer 4ab and first conductor layer 13ab is absorbed or reflected by the second wiring conductor layer 15b. Therefore, leakage of such light into the second semiconductor P layer 2b of the adjacent pixel through the gap between the gate semiconductor layer 4ba and first conductor layer 13ba of the adjacent pixel 11f is effectively prevented.

Embodiment 7

Figure 10:
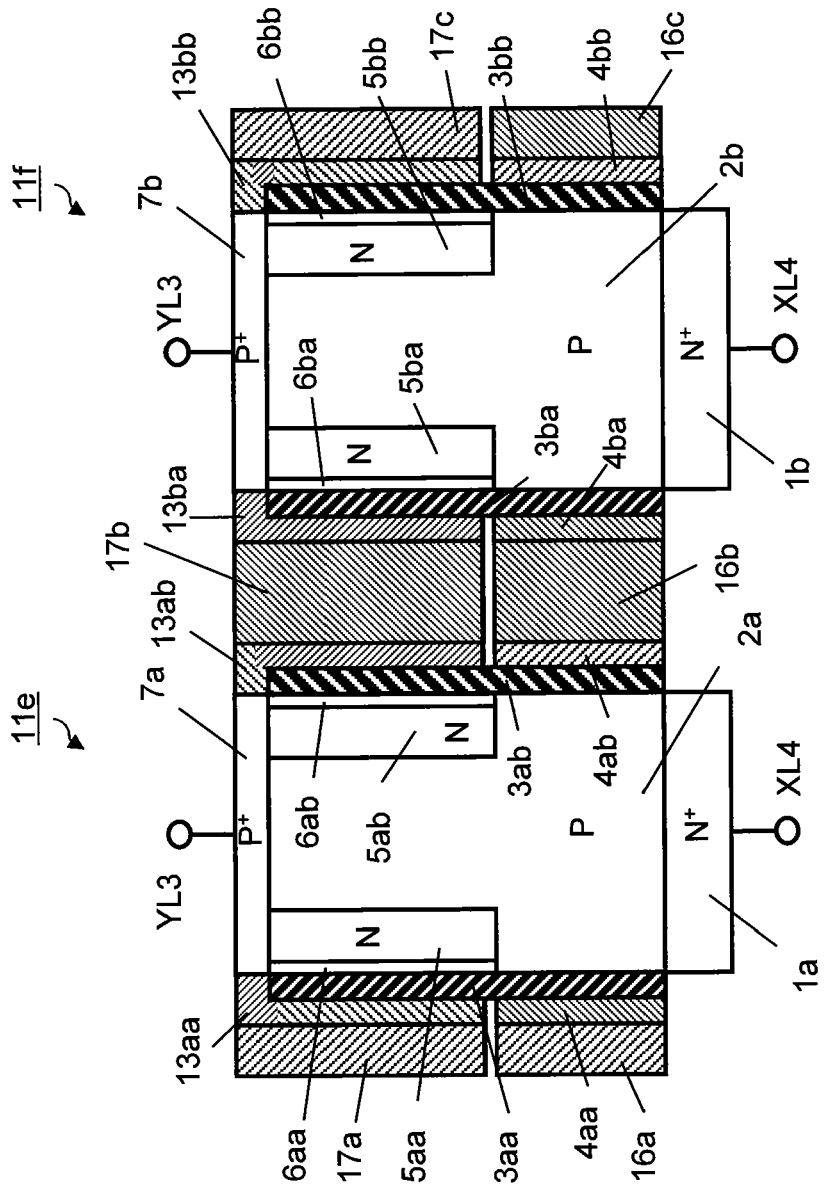
FIG. 10 is an illustration showing the pixel structure of a solid state imaging device according to Embodiment 7 of the present invention.

A solid state imaging device according to Embodiment 7 of the present invention will be described hereafter with reference to FIG. 10. The same components as those of Embodiment 4 are referred to by the same reference numbers. This embodiment is different from Embodiment 4 in that the space between the pixels 11e and 11f, namely both or one of the space between the first conductor layers 13aa, 13ab, 13ba, and 13bb and the space between the gate conductor layers 4aa, 4ab, 4ba, and 4bb is filled with the filling conductor layers (the second conductor layer) 16a to 16c and 17a to 17c. In this embodiment, both the space between the first conductor layers 13aa, 13ab, 13ba, and 13bb and the space between the gate conductor layers 4aa, 4ab, 4ba, and 4bb are filled with the filling conductor layers 16a to 16c and 17a to 17c. In such a case, the second wires YL3 and YL4 joined to the fifth semiconductor $P^+$ layers 7a and 7b, respectively, and the gate conductor layers 4aa, 4ab, 4ba, 4bb of the MOS transistors 111 are provided in the same wiring direction. When the second wires YL3 and YL4 and the gate conductor layers 4aa, 4ab, 4ba, and 4bb are provided in the wiring directions orthogonal to each other, either the space between the first conductor layers 13aa, 13ab, 13ba, and 13bb or the space between the gate conductor layers 4aa, 4ab, 4ba, and 4bb will be filled with the conductor layers 16a to 16c or 17a to 17c in the figure.

The filling conductor layers 16a to 16c and 17a to 17c are made of a light-blocking conductive material. Therefore, for example, the light entering the space between the pixels is absorbed or reflected by the filling conductor layers 16a to 16c and 17a to 17c. Hence, leakage of light into an adjacent pixel can effectively be prevented as in the solid state imaging devices of Embodiments 5 and 6.

Embodiment 8

Figure 11:
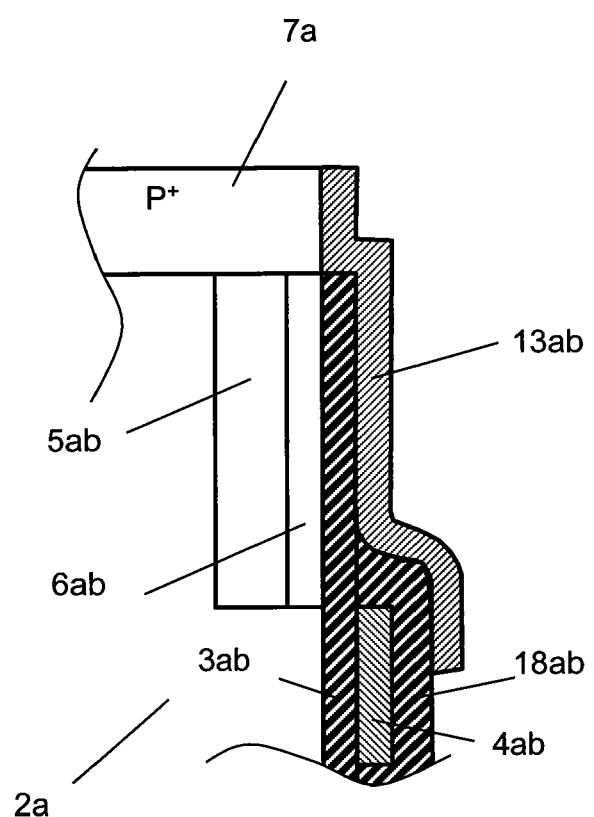
FIG. 11 is an illustration showing the pixel structure of a solid state imaging device according to Embodiment 8 of the present invention.

A solid state imaging device according to Embodiment 8 of the present invention will be described hereafter with reference to FIG. 11. The same components as those of Embodiment 4 are referred to by the same reference numbers. FIG. 11 is an enlarged view of a region including the second semiconductor P layer 2a, gate conductor layer 4ab, third semiconductor N layer 5ab, fourth semiconductor $P^+$ layer 6ab, and fifth semiconductor $P^+$ layer 7a of the pixel structure of the solid state imaging device of Embodiment 4. This embodiment is different from Embodiment 4 in that the first conductor layer 13ab joined to the fifth semiconductor $P^+$ layer 7a partially overlaps with the gate conductor layer 4ab via an insulting layer 18ab covering the gate conductor layer 4ab.

With the above structure, there is no gap between the gate conductor layer 4ab and first conductor layer 13ab, therefore, no leakage of light through such a gap occurs. Hence, leakage of light into an adjacent pixel can effectively be prevented. Consequently, the solid state imaging device of this embodiment can effectively prevent deteriorated resolution and mixed color.

Embodiment 9

Figure 12:
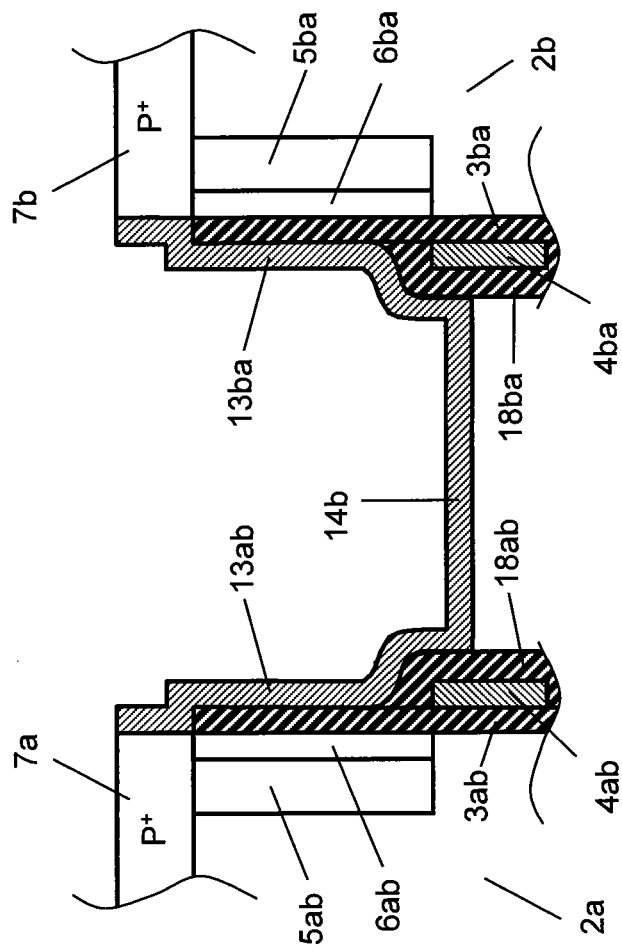
FIG. 12 is an illustration showing the pixel structure of a solid state imaging device according to Embodiment 9 of the present invention.

A solid state imaging device according to Embodiment 9 of the present invention will be described hereafter with reference to FIG. 12. The same components as those of Embodiment 5 are referred to by the same reference numbers. FIG. 12 is an enlarged view of a region including the second semiconductor P layers 2a and 2b, gate conductor layers 4ab and 4ba, third semiconductor N layers 5ab and 5ba, fourth semiconductor $P^+$ layers 6ab and 6ba, and fifth semiconductor $P^+$ layers 7a and 7b of the pixel structure of the solid state imaging device of Embodiment 5. This embodiment is different from Embodiment 5 in that the first conductor layers 13ab and 13ba partially overlap with the gate conductor layers 4ab and 4ba, respectively, via insulting layers 18ab and 18ba covering the gate conductor layers 4ab and 4ba.

With the above structure, as in the solid state imaging device of Embodiment 8, leakage of light into an adjacent pixel can effectively be prevented. Consequently, the solid state imaging device of this embodiment can effectively prevent deteriorated resolution and mixed color.

A method of producing the solid state imaging device according to Embodiment 9 will be described hereafter with reference to FIGS. 13 to 21.

Figure 13:
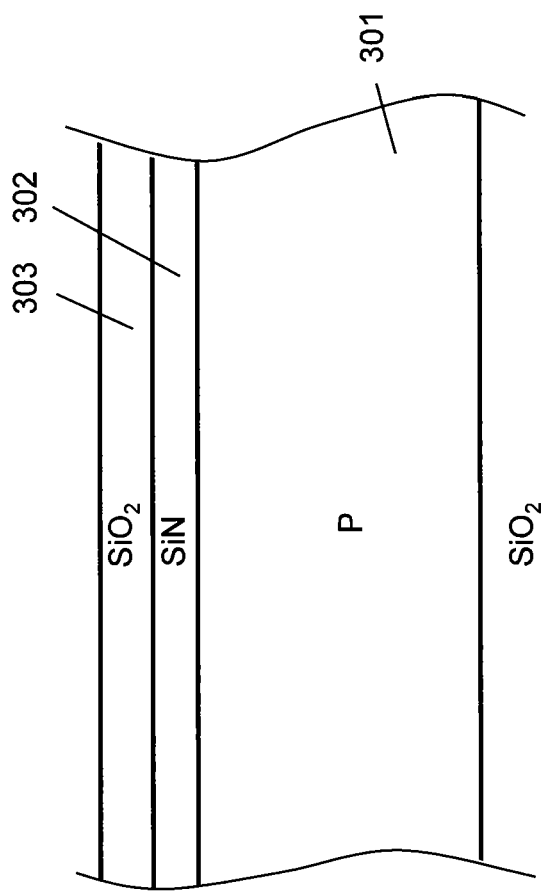
FIG. 13 is an illustration for explaining a method of producing the solid state imaging device according to Embodiment 9.
Figure 14:
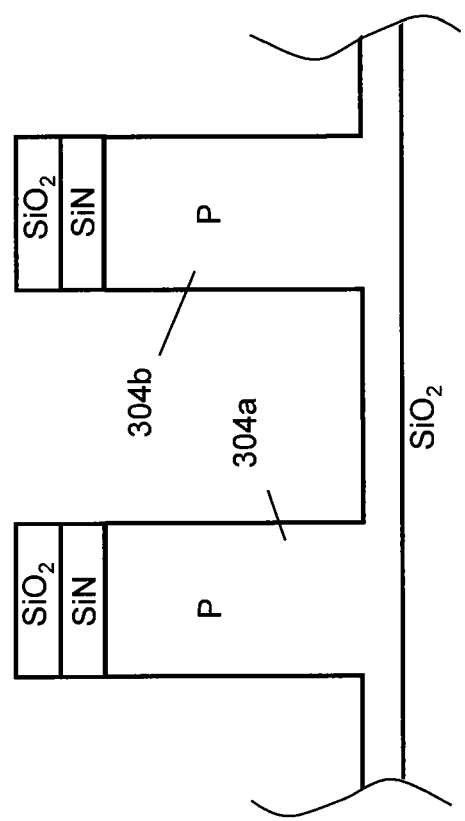
FIG. 14 is an illustration for explaining a method of producing the solid state imaging device according to Embodiment 9.
Figure 15:
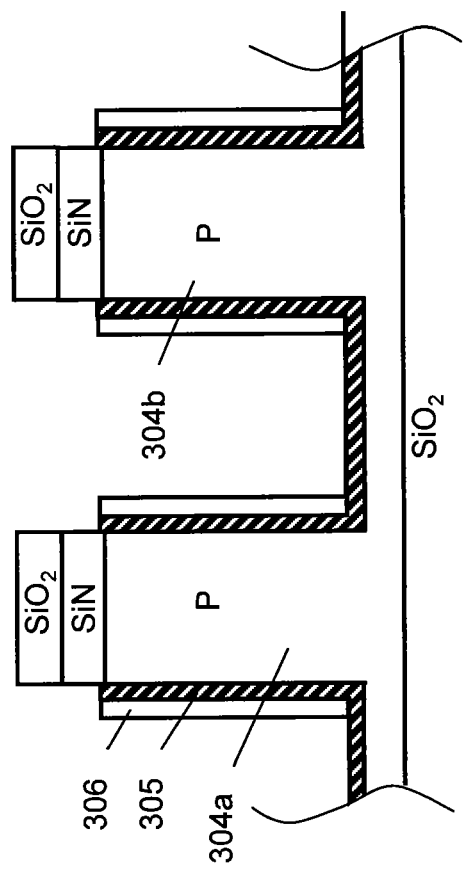
FIG. 15 is an illustration for explaining a method of producing the solid state imaging device according to Embodiment 9.

First, as shown in FIG. 13, a P-type silicon layer 301, a silicon nitride layer 302, and a silicon oxide layer 303 are deposited on a silicon ($SiO_2$) substrate. Then, as shown in FIG. 14, island-shaped semiconductor layers 304a and 304b are formed by etching. Then, for example, the substrate is heated in an oxygen atmosphere to oxidize the silicon surface and form a silicon oxide film 305. Then, polysilicon film is deposited and etched back to form a polysilicon sidewall film 306 as shown in FIG. 15.

Figure 16:
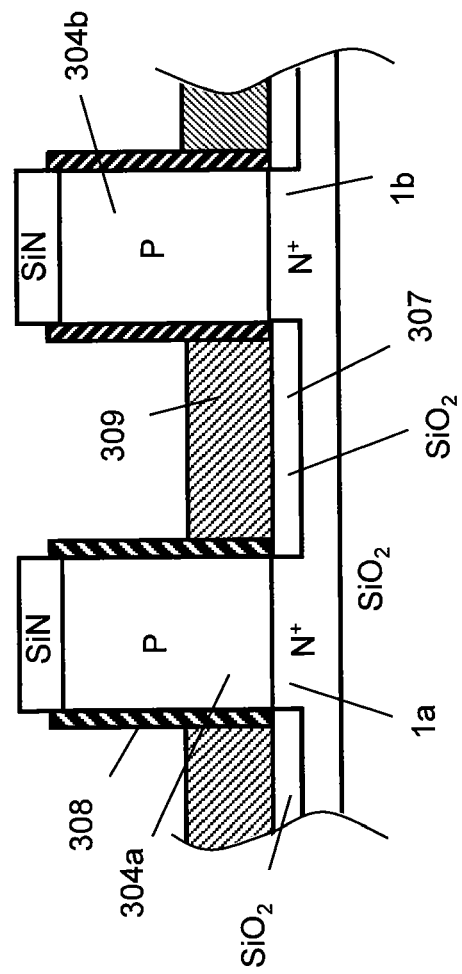
FIG. 16 is an illustration for explaining a method of producing the solid state imaging device according to Embodiment 9.
Figure 17:
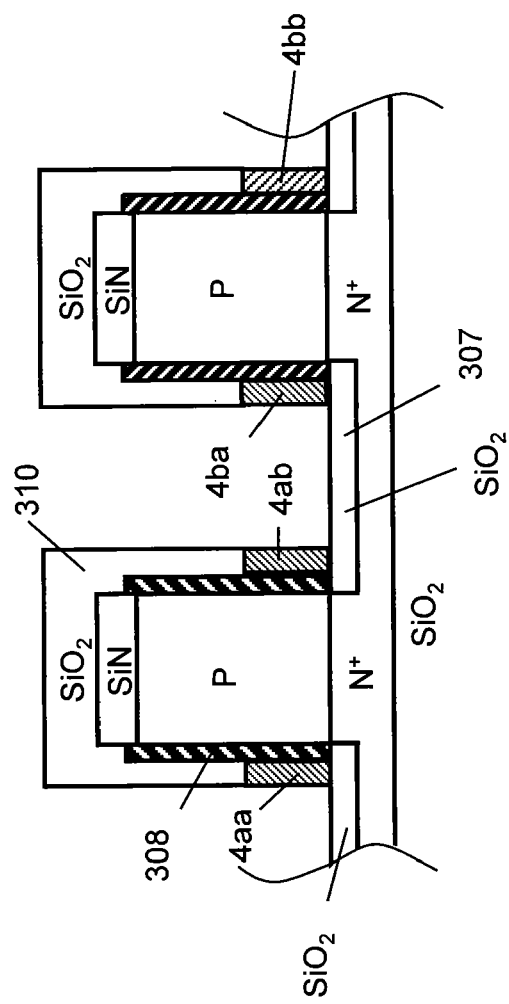
FIG. 17 is an illustration for explaining a method of producing the solid state imaging device according to Embodiment 9.

Then, phosphorus ions are implanted in the P-type silicon layer 301 by ion implantation to form the first semiconductor $N^+$ layers 1a and 1b. Then, the polysilicon film 306 and silicon oxide film 305 are etched off. Then, a silicon oxide film layer 307 is formed. A gate oxide film 308 is formed by gate oxidation. A polysilicon film 309 is deposited by CVD of thermal decomposition of monosilane as shown in FIG. 16. Then, a silicon oxide film ($SiO_2$ film) 310 is formed on the polysilicon film 309 in the region where the first gate conductor layers 4aa, 4ab, 4ba, and 4bb are defined. Then, the polysilicon film 309 other than the gate conductor layers 4aa, 4ab, 4ba, and 4bb is removed by etching using the $SiO_2$ film 310 or a resist film as a mask, whereby the gate conductor layers 4aa, 4ab, 4ba, and 4bb are formed as shown in FIG. 17. Then, the $SiO_2$ film 310 is removed and the polysilicon of the gate conductor layers 4aa, 4ab, 4ba, and 4bb is oxidized to form the insulating films 18aa, 18ab, 18ba, and 18bb.

Figure 18:
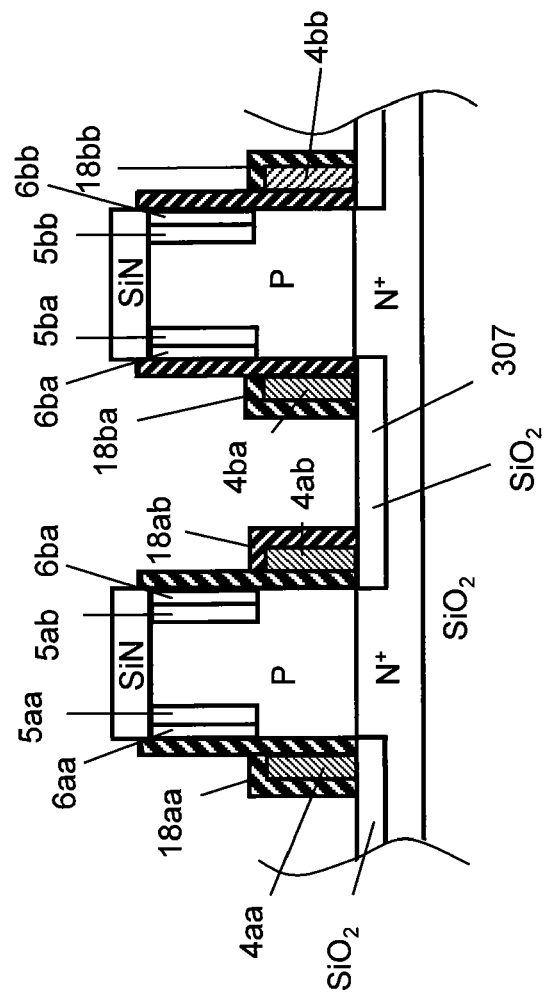
FIG. 18 is an illustration for explaining a method of producing the solid state imaging device according to Embodiment 9.
Figure 19:
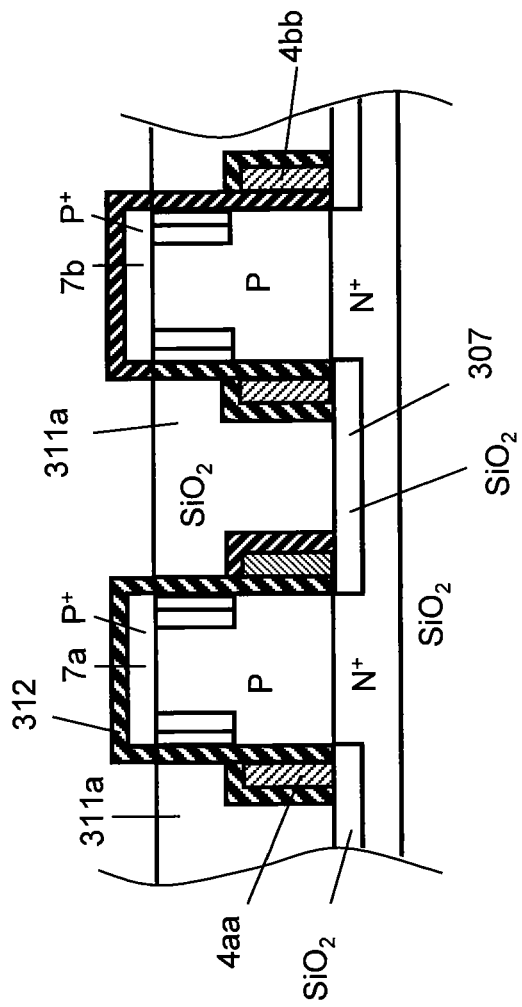
FIG. 19 is an illustration for explaining a method of producing the solid state imaging device according to Embodiment 9.
Figure 20:
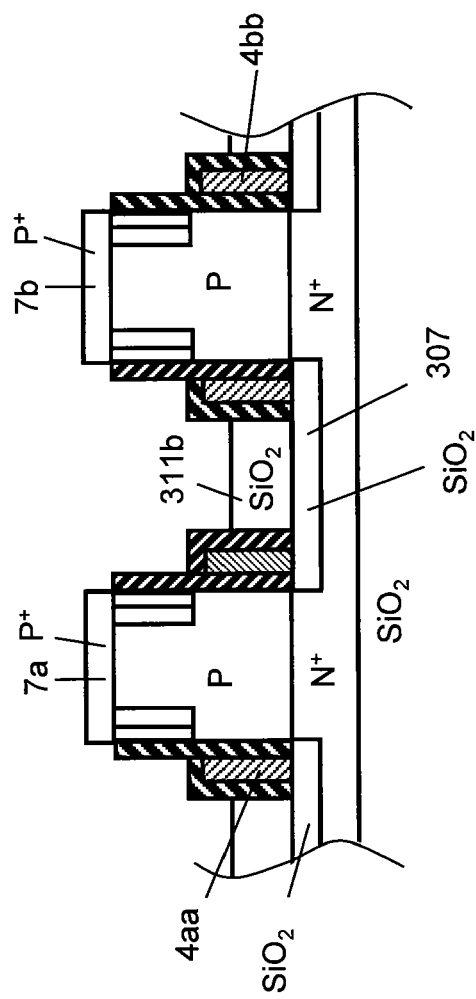
FIG. 20 is an illustration for explaining a method of producing the solid state imaging device according to Embodiment 9.
Figure 21:
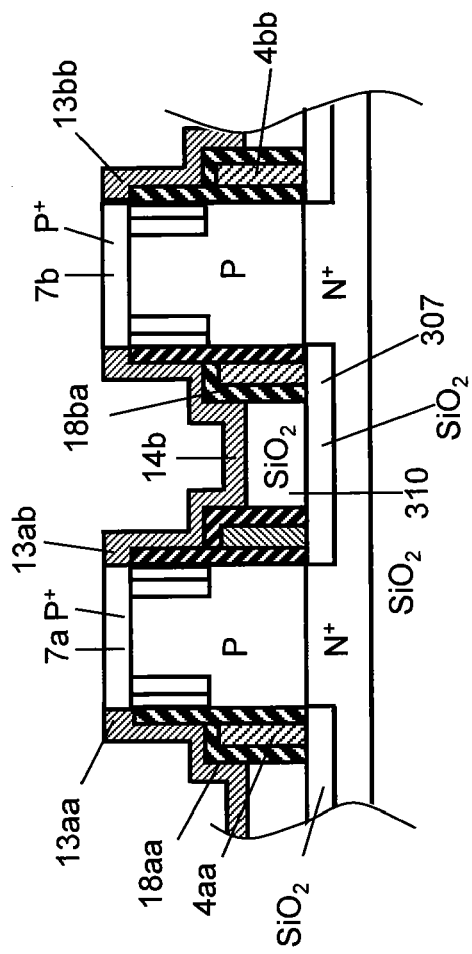
FIG. 21 is an illustration for explaining a method of producing the solid state imaging device according to Embodiment 9.

Then, phosphorus ions are implanted in the P-type silicon layer 301 by ion implantation to form the third semiconductor N-layers 5aa, 5ab, 5ba, and 5bb. Boron ions are further implanted in the third semiconductor N-layers 5aa, 5ab, 5ba, and 5bb by ion implantation to form the fourth semiconductor $P^+$ layers 6aa, 6ab, 6ba, and 6bb as shown in FIG. 18. Then, the silicon nitride film 302 is removed. Then, silicon oxide or silicon nitride is deposited, flattened, and etched back to form a silicon oxide film 311a. The exposed semiconductor layer is oxidized to form a silicon oxide film 312. Boron is implanted to form the fifth semiconductor $P^+$ layers 7a, 7b as shown in FIG. 19. Then, the silicon oxide film 312 is peeled off. The silicon oxide film 311a is removed by etching to the depth at which the first conductor layers 13ab and 13ba and the gate conductor layers 4ab and 4ba of the MOS transistors overlap with each other so as to form a silicon oxide film 311b as shown in FIG. 20. Then, the polysilicon of the gate conductor layers 4ab and 4ba is oxidized. Then, a metal film is formed on the entire surface of the substrate by vacuum deposition or sputtering and patterned to form the first conductor layers 13aa, 13ab, 13ba, and 13bb and the first wiring conductor layers 14a, 14b, and 14c. The first conductor layers 13aa, 13ab, 13ba, and 13bb are joined to the fifth semiconductor $P^+$ layers and the first wiring conductor layers 14a, 14b, and 14c connect the first conductor layers 13aa, 13ab, 13ba, and 13bb to each other.

The pixel structure of the solid state imaging device of Embodiment 9 is obtained in the above process. Furthermore, the pixel structure of the solid state imaging device of Embodiment 8 is obtained by patterning the metal film as shown in FIG. 11 in the step of forming the first conductor layers 13aa, 13ab, 13ba, and 13bb and first wiring conductor layers 14a, 14b, and 14c.

Embodiment 10

Figure 22:
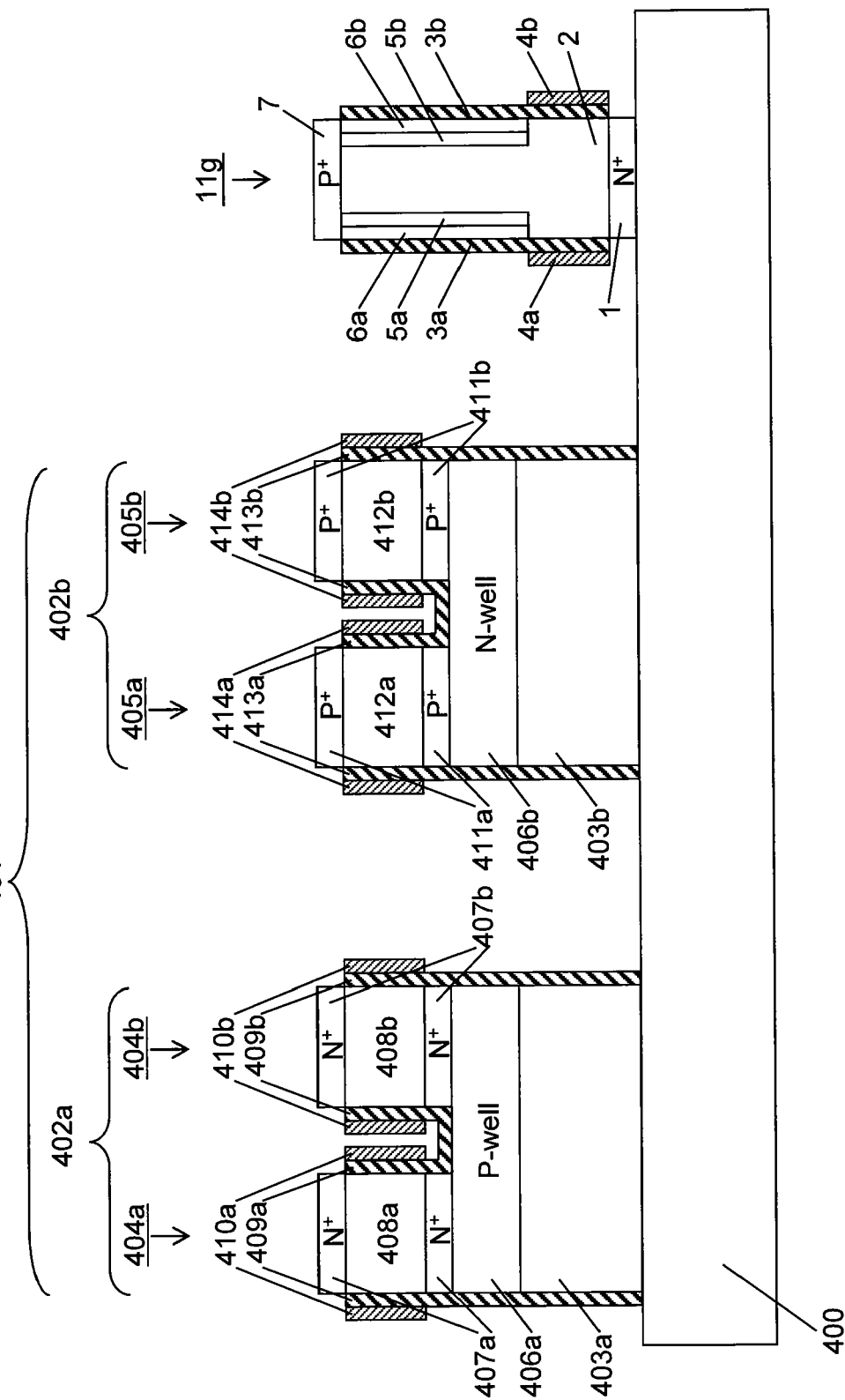
FIG. 22 is a cross-sectional view of a solid state imaging device according to Embodiment 10 of the present invention.

In a conventional solid state imaging device, the pixels, circuits driving the pixels, circuits retrieving signals from the pixels are formed on one and the same substrate. It is preferable that these circuits also have a three-dimensional structure in the solid state imaging devices according to Embodiments 1 to 9 having three-dimensionally structured pixels. For example, these circuits can consist of a SGT (surrounding gate transistor) described in H. Takato, K. Sunouchi, N. Okabe, A. Nitayama, K. Hieda, F. Horiguchi, F. Masuoka: "Impact of Surrounding Gate Transistor (SGT) for Ultra-High-Density LSI's", IEEE Transactions on Electron devices, Vol. 38, No. 3, pp. 573-578 (1991). Such a solid state imaging device will be described hereafter as Embodiment 10 with reference to FIG. 22. FIG. 22 is a cross-sectional view of a solid state imaging device according to Embodiment 10.

The solid state imaging device according to this embodiment comprises a substrate 400, one or multiple pixels 11g formed on the substrate 400, and a pixel drive and/or output circuit 401 formed on the substrate 400 for driving the pixel 11g and/or retrieving signals from the pixel 11g. The pixel 11g has the same pixel structure as the pixel 11 in Embodiment 1. The pixel drive and/or output circuit 401 comprises a CMOS circuit consisting of an N channel MOS transistor part 402a and a P channel MOS transistor part 402b. Here, the pixel drive and/or output circuit 401 represents a collection of the above-described vertical scanning circuit, horizontal scanning circuit, reset circuit, and correlated double sampling output circuit.

The N channel MOS transistor part 402a is composed of a semiconductor substrate layer 403a formed on the substrate 400, a P well layer 406a formed on the semiconductor substrate layer 403a, and one or multiple N channel MOS transistors 404a and 404b formed on the P well layer 406a. The N channel MOS transistors 404a and 404b are each composed of a semiconductor column 408 and 408b, a gate insulating layer 409a and 409b, a gate conductor layer 410a and 410b, and source/drain N$^+$ layers 407a and 407b, respectively. The gate insulating layers 409a and 409b surround the semiconductor columns 408a and 408b, respectively. The gate conductor layers 410a and 410b are formed on the gate insulating layers 409a and 409b so as to surround the semiconductor columns 408a and 408b, respectively. The source/drain N$^+$ layers 407a are formed on the top and the bottom of the semiconductor column 408a. The source/drain N$^+$ layers 407b are formed on the top and the bottom of the semiconductor column 408b. The N channel MOS transistor part 402a is formed in the manner that the height of the N channel MOS transistor part 402a between the substrate 400 and the uppermost source/drain N$^+$ layers 407a and 407b is equal to the height of the pixel 11g between the substrate 400 and the fifth semiconductor layer or P$^+$ layer 7. The P well layer 406a is connected to the power source and receives a P well voltage. The semiconductor columns 408a and 408b between the source/drain N$^+$ layers 407a and 407b serve as a channel for the N channel MOS transistors 404a and 404b, respectively.

The P channel MOS transistor part 402b is composed of a semiconductor substrate layer 403b formed on the substrate 400, an N well layer 406b formed on the semiconductor substrate layer 403b, and one or multiple P channel MOS transistors 405a and 405b formed on the N well layer 406b. The P channel MOS transistors 405a and 405b are each composed of a semiconductor column 412a and 412b, a gate insulating layer 413a and 413b, a gate conductor layer 414a and 414b, and source/drain P$^+$ layers 411a and 411b, respectively. The gate insulating layers 413a and 413b surround the semiconductor columns 412a and 412b, respectively. The gate conductor layers 414a and 414b are formed on the gate insulating layers 413a and 413b so as to surround the semiconductor columns 412a and 412b, respectively. The source/drain P$^+$ layers 411a are formed on the top and the bottom of the semiconductor column 412a. The source/drain P$^+$ layers 411b are formed on the top and the bottom of the semiconductor columns 412b. The P channel MOS transistor part 402b is formed in the manner that the height of the P channel MOS transistor part 402b between the substrate 400 and the uppermost source/drain P$^+$ layers 411a and 411b is equal to the height of the pixel 11g between the substrate 400 and the fifth semiconductor layer or P$^+$ layer 7. The N well layer 406b is connected to the power source and receives an N well voltage. The semiconductor columns 412a and 412b between the source/drain P$^+$ layers 411a or 411b serve as a channel for the P channel MOS transistors 405a and 405b, respectively.

The MOS transistors 404a, 404b, 405a, and 405b constituting the N channel and P channel MOS transistor parts 402a and 402b are electrically connected to each other, to the power source, or to the ground via wiring to form a CMOS circuit. Furthermore, the pixel drive and/or output circuit 401 is electrically connected to the pixel 11g via wiring.

With the above structure, the pixel 11g and the MOS transistors constituting the pixel drive and/or output circuit 401 are three-dimensionally constructed on one and the same substrate 400. Compared with the use of planar MOS transistors, the mounting area of the pixel 11g and pixel drive and/or output circuit 401 on the substrate 400 can be reduced. Then, the pixels can be provided at a higher density and a compact solid state imaging device can be realized. Furthermore, with the above structure, the N channel MOS transistor part 402a, P channel MOS transistor part 402b, and pixel 11g have the same height. The semiconductor columns serving as their body can be formed in the same step without adjusting individual etching or polishing conditions. Then, the solid state imaging device having the above structure according to Embodiment 10 can be produced by a simplified production process compared with the prior art solid state imaging device.

Embodiment 11

Figure 23:
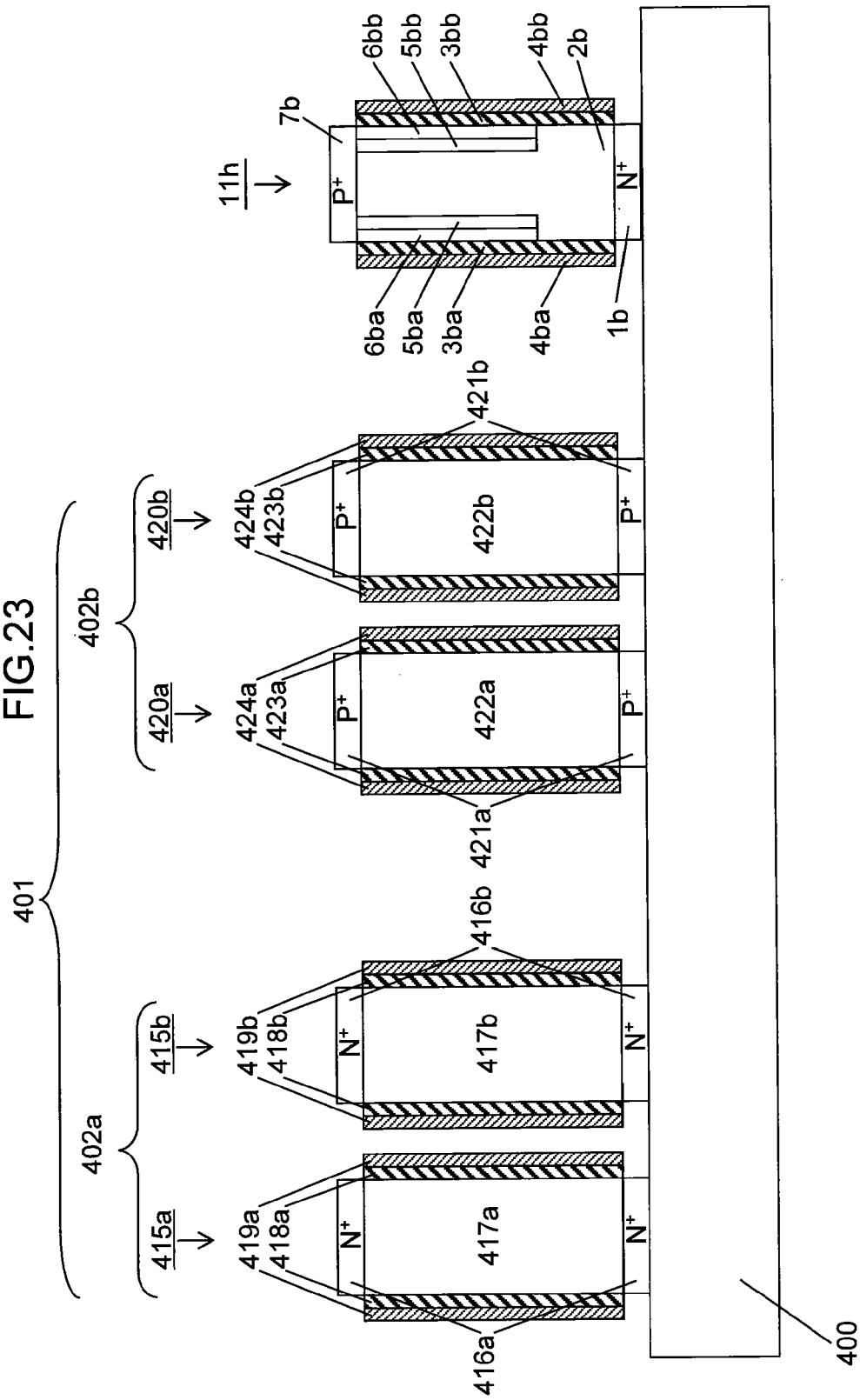
FIG. 23 is a cross-sectional view of a solid state imaging device according to Embodiment 11 of the present invention.

In the solid state imaging device according to Embodiment 10, the N channel MOS transistors and P channel MOS transistors are collectively formed on the P well layer and N well layer, respectively. Alternatively, they can individually be formed on the substrate. Such a solid state imaging device will be described as Embodiment 11 with reference to FIG. 23. FIG. 23 is a cross-sectional view of a solid state imaging device according to Embodiment 11.

The solid state imaging device according to this embodiment comprises a substrate 400, one or multiple pixels 11h formed on the substrate 400, and a pixel drive and/or output circuit 401 formed on the substrate 400 for driving the pixel 11h and/or retrieving signals from the pixel 11h. The pixel 11h has the same pixel structure as the pixel 11f in Embodiment 3. In other words, in the pixel 11h, the gate conductor layers 4ba and 4bb of a MOS transistor for reset operation is extended to cover the photodiode surface P$^+$ layer (the fourth semiconductor layer or P$^+$ layer) 6ba and 6bb. The pixel drive and/or output circuit 401 comprises a CMOS circuit consisting of an N channel MOS transistor part 402a and a P channel MOS transistor part 402b.

The N channel MOS transistor part 402a is composed of one or multiple N channel MOS transistors 415a and 415b formed on the substrate 400. The N channel MOS transistors 415a and 415b are each composed of a semiconductor column 417a and 417b, a gate insulating layer 418a and 418b, a gate conductor layer 419a and 419b, and source/drain N$^+$ layers 416a and 416b, respectively. The gate insulating layers 418a and 418b surround the semiconductor columns 417a and 417b, respectively. The gate conductor layers 419a and 419b are so formed on the gate insulating layers 418a and 418b as to surround the semiconductor columns 417a and 417b, respectively, and have the same height as the gate conductor layers 4ba and 4bb of the pixel 11h. The source/drain N$^+$ layers 416a are formed on the top and the bottom of the semiconductor columns 417a. The source/drain N$^+$ layers 416b are formed on the top and the bottom of the semiconductor columns 417b. The N channel MOS transistors 415a and 415b are formed in the manner that the height of the N channel MOS transistors 415a and 415b between the substrate 400 and the uppermost source/drain N$^+$ layers 416a and 416b is the same as the height of the pixel 11h between the substrate 400 and the firth semiconductor layer or P$^+$ layer 7b. The semiconductor columns 417a and 417b between the source/drain N$^+$ layers 416a or 416b serve as a channel for the N channel MOS transistors 415a and 415b, respectively.

The P channel MOS transistor part 402b is composed of one or multiple P channel MOS transistors 420a and 420b formed on the substrate 400. The P channel MOS transistors 420a and 420b are each composed of a semiconductor column 422a and 422b, a gate insulating layer 423a and 423b, a gate conductor layer 424a and 424b, and source/drain P$^+$ layers 421a and 421b, respectively. The gate insulating layers 423a and 423b surround the semiconductor columns 422a and 422b, respectively. The gate conductor layers 424a and 424b are so formed on the gate insulating layers 423a and 423b as to surround the semiconductor columns 422a and 422b, respectively, and have the same height as the gate conductor layers 4ba and 3bb of the pixel 11h. The source/drain P$^+$ layers 421a are formed on the top and the bottom of the semiconductor columns 422a. The source/drain P$^+$ layers 421b are formed on the top and the bottom of the semiconductor columns 422b. The P channel MOS transistors 420a and 420b are formed in the manner that the height of the P channel MOS transistors 420a and 420b between the substrate 400 and the uppermost source/drain P$^+$ layers 421a and 421b is the same as the height of the pixel 11h between the substrate 400 and the firth semiconductor layer or P$^+$ layer 7b. The semiconductor columns 422a and 422b between the source/drain P$^+$ layers 421a or 421b serve as a channel for the P channel MOS transistors 420a and 420b, respectively.

The MOS transistors 415a, 415b, 420a, and 420b constituting the N channel and P channel MOS transistor parts 402a and 402b are electrically connected to each other, to the power source, or to the ground via wiring to form a CMOS circuit. Furthermore, the pixel drive and/or output circuit 401 is electrically connected to the pixel 11h via wiring.

With the above structure, the pixel 11h and the MOS transistors constituting the pixel drive and/or output circuit 401 are three-dimensionally constructed on one and the same substrate 400. Compared with the use of planar MOS transistors in constructing the pixel drive and/or output circuit, the mounting area of the pixel 11h and pixel drive and/or output circuit 401 on the substrate 400 can be reduced. Then, the pixels can be provided at a higher density and a compact solid state imaging device can be realized. Furthermore, with the above structure, the N channel MOS transistors 415a and 415b, P channel MOS transistors 420a and 420b, and pixel 11h have the same height. The semiconductor columns serving as their body can be formed in the same step without adjusting individual etching or polishing conditions. Similarly, the gate conductor layers 419a, 419b, 424a, and 424b and the gate conductor layers 4ba and 4bb of the pixel 11h have the same height. They can be formed in the same step without adjusting individual etching or polishing conditions for each gate conductor layer. Then, the solid state imaging device having the above structure according to Embodiment 11 can be produced by a simplified production process compared with the solid state imaging device according to Embodiment 10. Furthermore, in order to set the voltages of the MOS transistors 415a, 415b, 420a, and 420b at a given threshold voltage, either the gate conductor layers 419a and 419b of the N channel MOS transistors 415a and 415b or the gate conductor layers 424a and 424b of the P channel MOS transistors 420a and 420b can be formed as the gate conductor layers 4ba and 4bb of the pixel 11h. Then, the solid state imaging device can be produced by a simplified production process compared with Embodiment 10.

Modified Embodiments

In the above Embodiments 1 to 9, the explanation is made as to the case wherein the first semiconductor layer is an N$^+$ layer. The same effect can be obtained in a solid state imaging device in which the polarities of the semiconductor layers are reversed, i.e. the first semiconductor layer is a P$^+$ layer, the second semiconductor layer is an N layer, the third semiconductor layer is a P layer, the fourth semiconductor layer on the photodiode surface is an N$^+$ layer, and the fifth semiconductor layer is an N$^+$ layer.

Furthermore, in the above Embodiments 1 to 6, 8, and 9, the wire joined to the first semiconductor N$^+$ layer 1 and the wire joined to the fifth semiconductor P$^+$ layer 7 are orthogonal to each other. They are not necessarily orthogonal to each other when the first semiconductor N$^+$ layer 1 is exclusively used as a drain for removing signal charges during the reset operation.

In the above Embodiment 2, the depleted layer 8c of the photodiode 112 occupies the upper region of the second semiconductor P layer 2 where the photodiode 112 is formed when no signal charges are accumulated in the photodiode region during the signal reading. If the depleted layer 8c of the photodiode 112 occupies the upper region of the second semiconductor P layer 2 even when a tiny amount of signal charges are accumulated in the photodiode region, the tiny amount of signal chare is not output as a signal. Therefore, the amplifying junction transistor may be designed to establish a channel in the photodiode region within an allowable range of operational margin.

In the above Embodiments 1 to 9, the explanation is made with one or two pixels. Needless to say, the present invention can be applied to a solid state imaging device in which the pixels are arranged in one-dimensional or two-dimensional array.

In the above Embodiments 1 to 9, the pixels can be arranged in a linear or zigzag pattern in the case of one-dimensional array and arranged in a linear lattice or honeycomb pattern in the case of two-dimensional array although they are not restricted thereto.

In the above Embodiments 1 to 9, at least the region where the photodiode 112 is formed (the upper region of the second semiconductor P layer 2 where the third semiconductor N layer 5a, 5b are formed and the third semiconductor N layer 5a, 5b), fourth semiconductor P$^+$ layer, and fifth semiconductor P$^+$ layer are formed in the shape of an island. This island-shaped semiconductor can be cylindrical, hexagonal, or in other shapes.

In the above Embodiments 5 to 7 and 9, the first conductor layers 13*aa*, 13*ab*, 13*ba*, and 13*bb*, first wiring conductor layers 14*a* to 14*c*, second wiring conductor layers 15*a* to 15*c*, and second conductor layers (filling conductor layers) 16*a* to 16*c* and 17*a* to 17*c* are distinguished in material. However, the same effect can be obtained even if they are made of the same material.

In the above Embodiments 1 to 9, the explanation is made as to solid state imaging devices generating signal charges in pixels upon light irradiation. Needless to say, the present invention can be applied to solid state imaging devices generating signal charges in pixels upon irradiation of electromagnetic energy waves such as visible light, ultraviolet light, infrared light, X-ray, other electromagnetic ray, radioactive ray, and an electron beam.

In the above Embodiment 7, the space between pixels is filled with the second conductor layers 16*a* to 16*c* and 17*a* to 17*c* to efficiently prevent leakage of light between pixels. The same effect can be obtained by filling with a conductor layer between the gate conductor layers 4*a* and 4*b* of the MOS transistors 111 of pixels of the solid state imaging device according to Embodiment 1.

In the above Embodiments 1 to 9, the second semiconductor P layer 2 serves as the channel of the MOS transistor 111. For example, an impurity can be implanted in a region of the second semiconductor P layer 2 by ion implantation to form a channel.

Furthermore, the first semiconductor layer 1 can be formed continuously over pixels or formed for each pixel. When the first semiconductor is formed for each pixel, the first semiconductor layers 1 can be connected each other by another metal wiring. The first and second semiconductor layers 1 and 2 do not need to be in contact with (jointed to) each other at the entire surface and can be in contact in part. Furthermore, the first semiconductor layer 1 can partly be replaced with another semiconductor layer.

In the above Embodiments 1 to 9, the conductor layers such as the gate conductor layer 4*a*, 4*b* of the MOS transistor 111 are made of a single material. For example, they can be composed of multiple layers such as metal layers and polycrystalline silicon layer.

In the above Embodiments 10 and 11, the pixel drive and/or output circuit 401 comprises a vertical scanning circuit, horizontal scanning circuit, reset circuit, and correlated double sampling circuit and may comprise other circuits for controlling the pixel. For example, the pixel drive and/or output circuit 401 may comprise a signal preprocessing circuit provided next to each pixel or a MOS transistor controlling the timing of retrieving pixel signals.

In the above Embodiments 10 and 11, the fifth semiconductor or P$^+$ layer 7 or 7*b* and some of the source/drain layers 407*a*, 407*b*, 411*a*, 411*b*, 416*a*, 416*b*, 421*a*, and 412*b* formed above the semiconductor columns 408*a*, 408*b*; 412*a*, 412*b*, 417*a*, 417*b*, 422*a*, and 422*b* of the N channel and P channel MOS transistor parts 402*a* and 402*b* of a pixel can separately be formed by ion implantation and epitaxial growth. In such a case, there may be a slight difference in the position in the height direction between the fifth semiconductor or P$^+$ layer 7 or 7*b* and the source/drain layers 407*a*, 407*b*, 411*a*, 411*b*, 416*a*, 416*b*, 421*a*, and 412*b* formed above the semiconductor columns 408*a*, 408*b*, 412*a*, 412*b*, 417*a*, 417*b*, 422*a*, and 422*b* of the N channel and P channel MOS transistor parts 402*a* and 402*b*. However, the effect and benefit of the present invention is not impaired. For example, even in a solid state imaging device according to this modified embodiment, the semiconductor columns serving as the body of the N channel MOS transistor part 402*a*, P channel MOS transistor part 402*b*, and pixel 11*g* or 11*h* can be formed in the same step without adjusting individual etching or polishing conditions as in the solid state imaging devices according to Embodiments 10 and 11.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A solid state imaging device including one or multiple pixels, each of the pixels comprising:
    a first semiconductor layer formed on a substrate,
    a second semiconductor layer formed on the first semiconductor layer,
    a first insulating film formed on a lower side of the second semiconductor layer,
    a gate conductor layer formed on the lower side of the second semiconductor layer via the first insulating film,
    a third semiconductor layer formed in an upper side of the second semiconductor layer,
    a fourth semiconductor layer formed on a side of the third semiconductor layer that is not facing a side of the second semiconductor layer, and
    a fifth semiconductor layer formed on top of the second semiconductor layer and the third semiconductor layer, the fifth semiconductor layer electrically connected to the fourth semiconductor layer,
    wherein
    at least the third semiconductor layer, the upper region of the second semiconductor layer where the third semiconductor layer is formed, the fourth semiconductor layer, and the fifth semiconductor layer are formed in an island,
    a diode comprises the second semiconductor layer and the third semiconductor layer,
    a junction transistor comprises the diode serving as a gate thereof and the second semiconductor layer serving as a channel thereof, the channel being between the first semiconductor layer and the fifth semiconductor layer,
    a MOS transistor comprises the gate semiconductor layer serving as a gate thereof and the second semiconductor layer serving as a channel thereof, the channel being between the first semiconductor layer and the third semiconductor layer,
    a signal charge generated by an electromagnetic energy wave is accumulated in the diode,
    current flowing to the junction transistor and changing in accordance with amount of the signal charge accumulated in the diode is detected as a signal,
    the signal charge accumulated in the diode is removed at the first semiconductor layer through the MOS transistor channel,
    the fourth semiconductor layer and the fifth semiconductor layer have same voltage.

2. The solid state imaging device according to claim 1 wherein,
    the second semiconductor layer is a conductivity type opposite to the conductivity type of the first semiconductor layer, or a substantially intrinsic type,
    the third semiconductor layer has a conductivity type the same as a conductivity type of the first semiconductor layer, the fourth semiconductor layer has a conductivity type opposite to a conductivity type of the first semiconductor layer, the fifth semiconductor layer has a conductivity type opposite to a conductivity type of the first semiconductor layer, and the fourth and fifth semiconductor layers are connected to each other.

3. The solid state imaging device according to claim 1, further comprising a first conductor layer formed on the side of the fourth semiconductor layer via the first insulating film so as to enclose the third semiconductor layer, an upper region of the second semiconductor layer, and the fourth semiconductor layer in the shape of the island, the first conductor layer including a light-blocking conductive material, wherein the first conductor layer is connected to the fifth semiconductor layer.

4. The solid state imaging device according to claim 3, further comprising:

a gap between the first conductor layer and the gate conductor layer; and a first wiring conductor layer connecting the first conductor layers of adjacent pixels in a space near the gap between the first conductor layer and the gate conductor layer, the space being between the pixels, and the first wiring conductor layer including a light-blocking conductive material.

5. The solid state imaging device according to claim 3, further comprising a second insulating film covering the gate conductor layer, wherein the first conductor layer overlaps with at least part of the gate conductor layer via the second insulating film.

6. The solid state imaging device according to claim 3, further comprising:

a gap between the first conductor layer and the gate conductor layer; and a second wiring conductor layer connecting the gate conductor layers of adjacent pixels in a space near the gap between the first conductor layer and the gate conductor layer, the space being between the pixels, and the second wiring conductor layer including a light-blocking conductive material.

7. The solid state imaging device according to claim 3, further comprising:

a second conductor layer filling between the first conductor layers of adjacent pixels, between the gate conductor layers of adjacent pixels, or between the first conductor layers of adjacent pixels and between the gate conductor layers of adjacent pixels, and the second conductor layer including a light-blocking conductive material.

8. The solid state imaging device according to claim 1, wherein the gate conductor layer extends onto the side of the fourth semiconductor layer via the first insulating film so as to enclose the third semiconductor layer, an upper region of the second semiconductor layer, and the fourth semiconductor layer in the shape of the island, the gate conductor layer including a light-blocking conductive material.

9. The solid state imaging device according to claim 1 comprising:

a unit for accumulating a signal charge in the third semiconductor layer and the second semiconductor layer near the third semiconductor layer according to a quantity of electromagnetic energy wave irradiation;

a signal reading unit for measuring a current running between the fifth semiconductor layer and the second semiconductor layer near the first semiconductor layer so as to measure the accumulated signal charge for reading signals; and a reset unit for applying an ON voltage to the gate conductor layer to create a channel in a region including the second semiconductor layer between the first semiconductor layer and the third semiconductor layer, whereby the signal charge accumulated in the third semiconductor layer is discharged to the first semiconductor layer and removed, wherein the signal reading unit sets potentials so that the potentials become deeper in a following order: the potential of the first semiconductor layer; the potential of the fifth semiconductor layer; and the deepest potential in the third semiconductor layer, the deepest potential in the third semiconductor layer being a potential when no signal charge is accumulated in the third semiconductor layer and the second semiconductor layer near the third semiconductor layer, and the reset unit sets potentials so that the potentials become deeper in a following order: the potential of the fifth semiconductor layer; the deepest potential in the third semiconductor layer; the potential of a channel in a region including the second semiconductor layer between the first semiconductor layer and the third semiconductor layer when an ON voltage is applied to the gate conductor layer; and the potential of the first semiconductor layer, the deepest potential in the third semiconductor layer being a potential when no signal charge is accumulated in the third semiconductor layer and the second semiconductor layer near the third semiconductor layer.

10. The solid state imaging device according to claim 9, wherein in a relationship of the potentials set by the signal reading unit, a depleted layer formed in an upper region of the second semiconductor layer occupies the upper region of the second semiconductor layer when no signal charge is accumulated in the third semiconductor layer and the second semiconductor layer near the third semiconductor layer, the third semiconductor layer being formed in the upper region of the second semiconductor layer, and in a relationship of the potentials set by the signal reading unit, a thickness of the depleted layer varies according to the accumulated signal charge when the signal charge is accumulated in the third semiconductor layer and the second semiconductor layer near the third semiconductor layer.

11. The solid state imaging device according to claim 1, comprising a pixel drive/output unit driving the pixel and retrieving signals from the pixel, wherein the pixel drive/output unit is composed of multiple surrounding gate transistors.

12. The solid state imaging device according to claim 3, comprising a pixel drive/output unit driving the pixel and retrieving signals from the pixel, wherein the pixel drive/output unit is composed of multiple surrounding gate transistors, each of the surrounding gate transistors each comprises a gate conductor layer, and the gate conductor layers of the multiple surrounding gate transistors and the first conductor layers of the one or multiple pixels have the same height.

* * * * *